(12) United States Patent
Eriguchi et al.

(10) Patent No.: US 6,583,640 B2
(45) Date of Patent: Jun. 24, 2003

(54) METHOD AND APPARATUS FOR EVALUATING INSULATING FILM

(75) Inventors: Koji Eriguchi, Kusatsu (JP); Yukiko Hashimoto, Suita (JP); Akio Watakabe, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/808,100

(22) Filed: Mar. 15, 2001

(65) Prior Publication Data

US 2002/0024351 A1 Feb. 28, 2002

(30) Foreign Application Priority Data

Mar. 17, 2000 (JP) ........................................ 2000-076130

(51) Int. Cl.[7] ................................................ G01R 31/26
(52) U.S. Cl. ..................... 324/765; 324/158.1; 324/756
(58) Field of Search ................................. 324/754, 755, 324/761, 756, 158.1, 73.1, 72.5, 765; 439/482, 843

(56) References Cited

U.S. PATENT DOCUMENTS 6,060,891 A * 5/2000 Hembree et al. ........... 324/754
6,181,145 B1 * 1/2001 Tomita et al. .............. 324/754
6,249,135 B1 * 6/2001 Maruyama et al. ......... 324/755
6,323,663 B1 * 11/2001 Nakata et al. .............. 324/754

OTHER PUBLICATIONS

T. Nigam et al., "Constant Current Charge–to breakdown: still a valid tool to study the reliability of MOS structures'", IEEE 98CH36173, 36th Annual International Reliability Physics Symposium, Reno, Nevada, pp. 62–69, 1998.

* cited by examiner

Primary Examiner—Kamand Cuneo
Assistant Examiner—Tung X. Nguyen
(74) Attorney, Agent, or Firm—Nixon Peabody LLP; Thomas W. Cole

(57) ABSTRACT

There is provided a method for evaluating an insulating film entirely provided on a conductor layer for the characteristics or dimensions thereof. A measuring member having conductor bumps arranged thereon to be connected to wires is disposed above the insulating film on the conductor layer. Then, the conductor bumps are pressed against the insulating film with a given pressing force. By applying a voltage (electric stress) between the conductor bumps and the conductor layer, the characteristics including I-V characteristic, gate leakage current, and TDDB or the dimensions including thickness are evaluated.

5 Claims, 22 Drawing Sheets

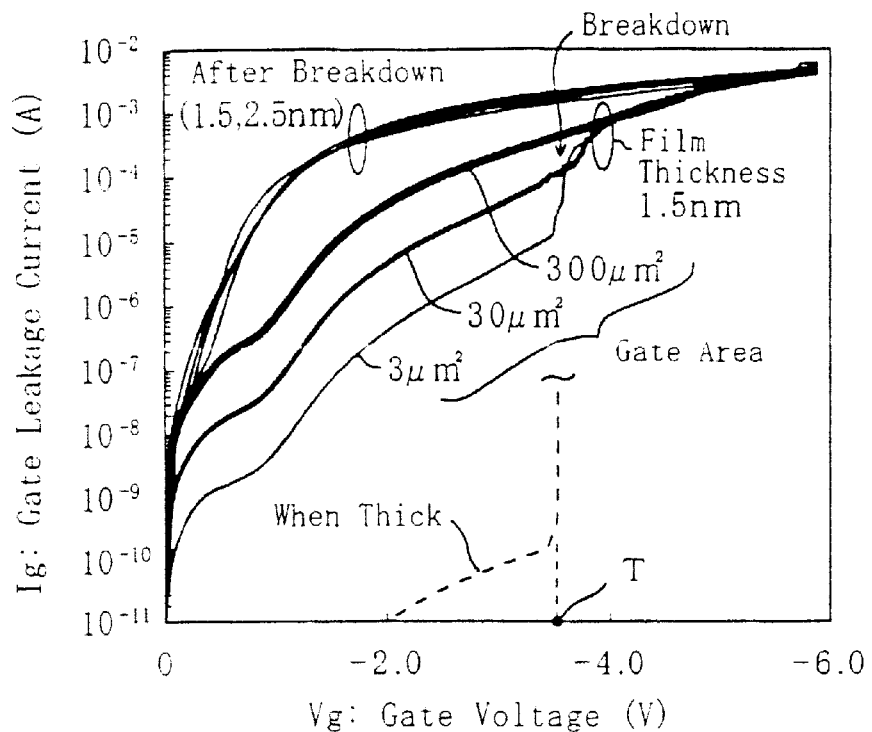
Prior Art
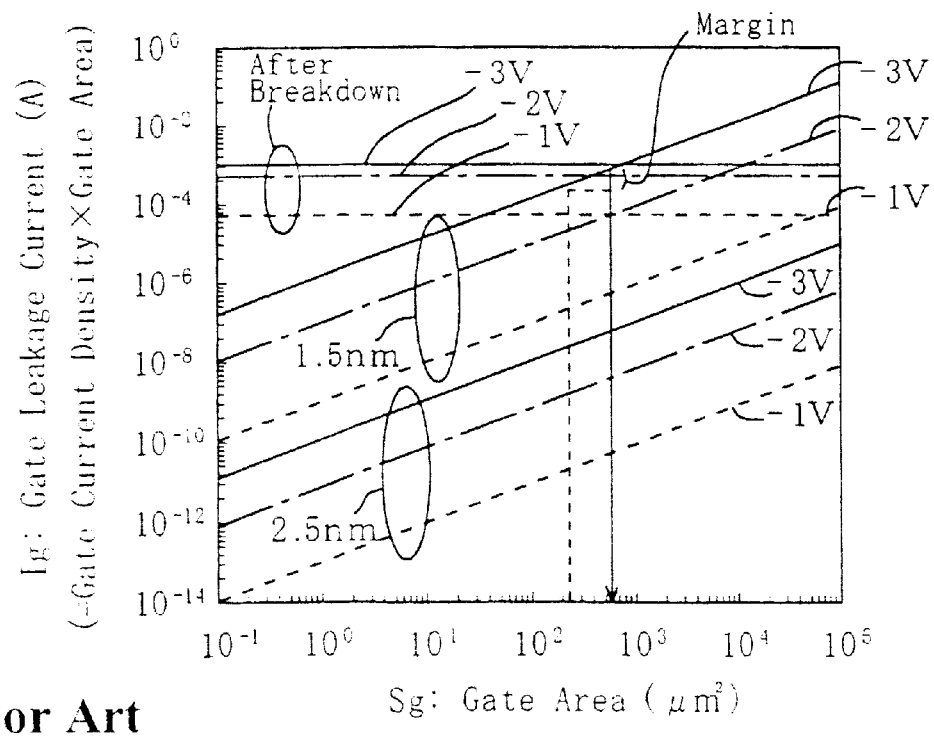
Prior Art

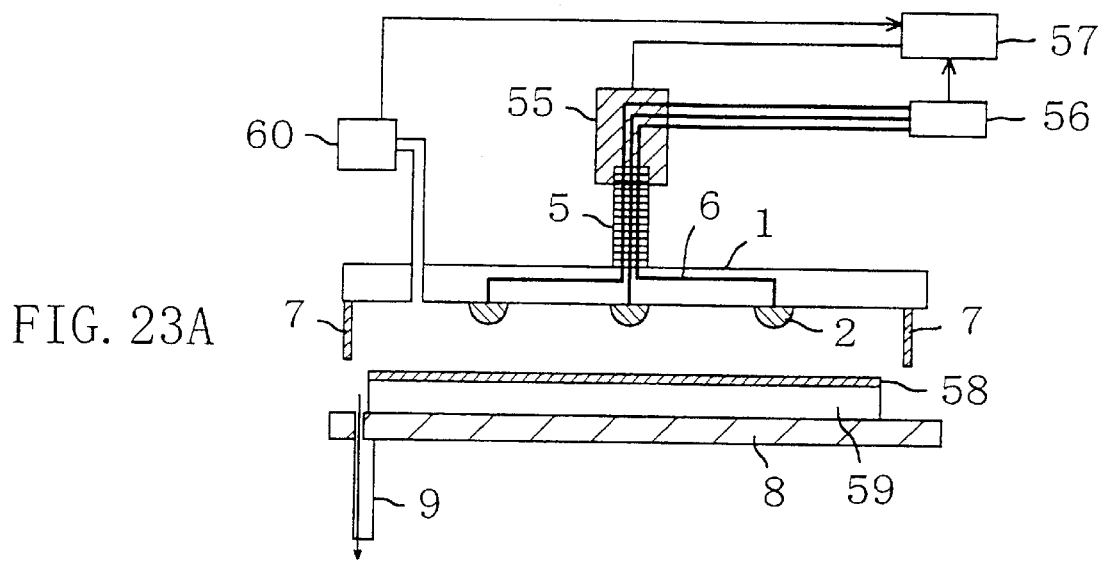
FIG. 23A
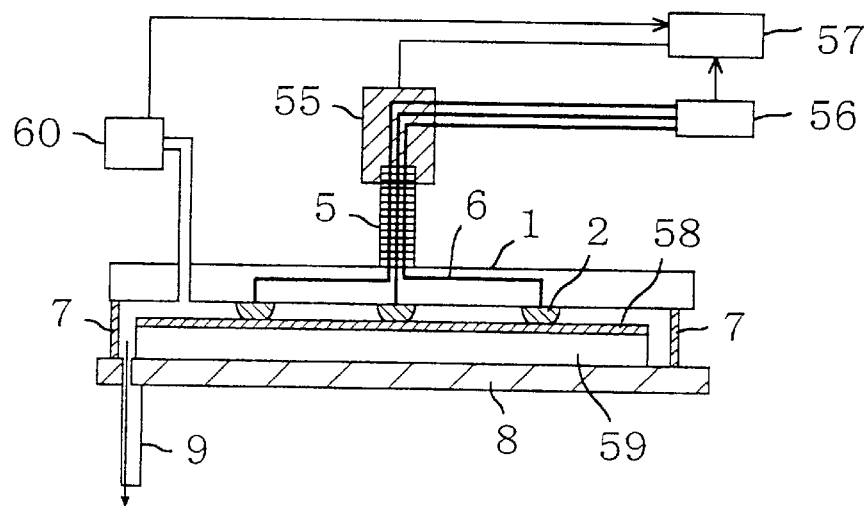
FIG. 23B
FIG. 23C

METHOD AND APPARATUS FOR EVALUATING INSULATING FILM

BACKGROUND OF THE INVENTION

The present invention relates to a method and apparatus for evaluating the characteristics of an insulating film provided on a semiconductor substrate, particularly an ultra-thin gate insulating film.

As the degree of integration in a semiconductor integrated circuit device has increased significantly in recent years, elements including transistors in a MIS semiconductor device have been required to be smaller in size and higher in performance to correspond to the higher degree of integration. As the elements including the transistors have become smaller in size and higher in performance, the implementation of a MIS (Metal Insulator Semiconductor) structure with high reliability has been in greater demand. To provide a MIS structure with higher reliability, each of the components of the MIS structure which are a gate electrode (Metal), a gate insulating film (Insulator), and a semiconductor substrate (Semiconductor) should have high reliability.

The gate insulating film which is one of the elements composing the MIS structure is expected to be rapidly reduced in thickness to correspond to further miniaturization and higher-speed and lower-voltage operation of the transistors. It is expected that an extremely thin insulating film with a thickness of 2 nm or less will be used actually in the 21st century. The implementation of an excellent gate insulating film is so important an issue as to say that the characteristics of the gate insulating film determine the characteristics of the MIS transistor and therefore the electric characteristic of the semiconductor integrated circuit device.

As a material composing a gate insulating film, a silicon dioxide ($SiO_2$) has been used conventionally. However, the limited TDDB (Time Dependent Dielectric Breakdown) reliability of a gate oxide film, i.e., $SiO_2$ film is expected to be among factors which impair the reliability of an LSI device in the future. If the thickness of the gate oxide film is reduced increasingly to reach 2 nm or less, the problem arises that a tunneling current induced by direct tunneling of carriers through the gate oxide film, i.e., a gate leakage current is further increased. In a system LSI, in particular, such an increased leakage current incurs a significant increase in the power consumption of the LSI device so that a large number of new materials replacing $SiO_2$ have been proposed as materials composing the gate insulating film in terms of power consumption (Reference: 1999-ITRS Roadmap). Thus, the increased leakage current in the gate oxide film has requested revolutions in the development of a gate insulating film and new materials as well as in quality control at a manufacturing site.

As a test for examining the reliability of a gate insulating film, a so-called TDDB test has been performed conventionally in an accelerated environment. The TDDB test performed under the accelerated environment is a method for examining the lifetime of an insulating film till it reaches a dielectric breakdown by applying a voltage higher than a working voltage, increasing the temperature, examining the current-voltage characteristic (I-V characteristic), and judging that the insulating film breaks down when a current increases abruptly. In the TDDB test, it is general to examine the I-V characteristic and determine, as the lifetime, the time elapsed till an abrupt change is observed in leakage current, while monitoring an amount of leakage current. During the test, measurement using a MIS structure which is a capacitor occupying a large area has been performed normally in terms of examining a defect density in the gate insulating film.

For in-line evaluation, a so-called Hg prober test has also been used widely in which the I-V characteristic and the like are evaluated by pressing a mercury terminal functioning as a gate electrode against a gate insulating film that has been formed previously to omit the step of forming the gate electrode composing a MIS structure (see, e.g., Japanese Unexamined Patent Publication No. HEI 06-140478). The Hg prober method is performed primarily for the development of an insulating film material, control in the process of fabricating an insulating film, a reliability test for an insulating film, or the like.

In general, the breakdown of a gate insulating film in each of the foregoing tests is judged by an abrupt increase in leakage current. In the TDDB test, a MIS structure (which is also a MIS capacitor) having a gate area of 0.01 $mm^2$ or more is used widely to provide a sufficient sensitivity with which a current value is detected. In the evaluation method using a Hg prober also, the contact area between the mercury terminal and the gate insulating film is as large as 0.01 $mm^2$ or more due to the structure of the mercury terminal.

As a result of a further increase in leakage current induced by a recent reduction in the thickness of the gate insulating film, it may be difficult to judge the time at which the gate insulating film breaks down in a test for evaluating the quality of a gate insulating film by observing the I-V characteristic as described above. In addition, a phenomenon termed a false breakdown in a thin film on a 2-nm level, which is different from the conventional breakdown, has made the judgment of a breakdown difficult. A description will be given herein below to the cause of the difficulty by using the TDDB test as an example.

FIG. 1 is a view showing the I-V characteristic of a thermal oxide film ($SiO_2$ film) with a thickness of 1.5 nm provided on a p-type silicon substrate by using a gate area as a parameter. In the drawing, the horizontal axis represents a gate voltage (V) and a vertical axis represents the absolute value of a gate leakage current (A). As can be seen from the drawing, the gate leakage current value increases as the gate area increases to reach 3 $\mu m^2$, 30 $\mu m^2$, and 300 $\mu m^2$. If a comparison is made between leakage current densities obtained by dividing the gate leakage values by the respective gate areas, however, it will be understood that each of the leakage current densities has a nearly equal value. In FIG. 1, there are also shown the I-V characteristics of gate insulating films with respective thicknesses of 1.5 nm and 2.5 nm that have broken down. It will be understood that a substantially uniform characteristic is obtained after the dielectric breakdown irrespective of a difference in film thickness whether the thickness of a gate insulating film is 2.5 nm or 1.5 nm. This may be because the dielectric breakdown has occurred at a certain local leakage spot in the gate insulating film.

However, as the gate area becomes larger to reach 3 $\mu m^2$, 30 $\mu m^2$, and 300 $\mu m^2$, the timing T with which the gate leakage current increases abruptly (the time of breakdown) for the judgment of breakdown becomes less distinct, as shown in FIG. 1. When the gate insulating film has a large thickness, the timing with which the gate leakage current increases abruptly is distinct as indicated by the broken curve in the drawing. However, the distance between the initial I-V characteristic curve and the post-breakdown I-V characteristic curve is reduced as the thickness of the gate insulating film is reduced, so that it becomes more difficult to recognize the time T at which the gate insulating film breaks down.

FIG. 2 is a view showing the relationship between the gate area and the gate leakage current by using a gate voltage as a parameter, which is for determining the critical value of the gate area over which the breakdown of the gate insulating film cannot be detected any more. In the drawing, the horizontal axis represents the gate area ($\mu m^2$) and the vertical axis represents the gate leakage current (A). By way of example, FIG. 2 shows the case where the thicknesses of the gate insulating films are 1.5 nm and 2.5 nm. In the I-V characteristics shown in FIG. 1, the gate leakage current Ig is determined uniquely if the gate voltage Vg and the gate area Sg are determined. It may be said that the relationship shown in FIG. 2 is obtained by plotting the values of the leakage current Ig at a given gate voltage Vg in FIG. 1.

If the gate leakage current is Ig, the gate current density is Dg, and the gate area is Sg, the following expression:

$$Ig=Dg \times Sg$$

is satisfied so that the following expression:

$$\log Ig = \log Dg + \log Sg$$

is also satisfied. Since the gate leakage current Ig is necessarily represented by a straight line having a gradient of 1 relative to the gate area Sg in the coordinate system shown in FIG. 2, if a gate leakage current Ig when a given gate voltage Vg is applied to a gate insulating film having a gate area Sg is determined in FIG. 1, the Ig-Sg characteristic curve of the gate insulating film having a given thickness is determined by drawing a straight line having a gradient of 1 and passing through a point on the coordinates determined by the gate area Sg and the gate leakage current Ig. On the other hand, the gate leakage current Ig after the breakdown of the gate insulating film has a constant value determined by the gate voltage Vg irrelevantly to the gate area Sg so that the post-breakdown Ig-Sg characteristic curve is represented by a straight line parallel to the horizontal axis. It is to be noted that, in FIG. 2, the segments of the pre-breakdown Ig-Sg characteristic lines located above the points of intersection with the post-breakdown Ig-Sg characteristic lines are obtained by simply extending the segments thereof located below the points of intersection and therefore do not actually exist.

At each of the points of intersection between the pre- and post-breakdown characteristic lines, the gate leakage current Ig before the breakdown of the gate insulating film coincides with the gate leakage current Ig after the breakdown. Since the pre- and post-breakdown I-V characteristic lines thus coincide with each other in the I-V characteristic of the gate insulating film having the gate area Sg at the point of intersection shown in FIG. 1, the time at which the gate leakage current Ig changes abruptly is barely observed and the time of breakdown cannot be detected.

In other words, for a gate insulating film having a given thickness to which a given voltage Vg is applied, it is difficult to detect the time of breakdown unless a gate area Sg which caused a gate leakage current Ig smaller than the gate leakage current Ig at the point of intersection between the pre-breakdown Ig-Sg characteristic curve and the post-breakdown Ig-Sg characteristic curve by a specified margin is provided. If it is assumed that the thickness of the gate insulating film is 1.5 nm and the gate voltage Vg in use is −3 V. it is necessary to perform measurement with a gate area which causes a gate leakage current Ig smaller, by a specified margin, than the gate leakage current Ig at the point of intersection (the point at which the gate area corresponds to about 1000 $\mu m^2$) between the pre- and post-breakdown Ig-Sg characteristic curves of the gate insulating film with a thickness of 1.5 nm shown in FIG. 2, e.g., with a gate area of 20 $\mu m^2$ or less for ensured detection of the tome of the breakdown of the gate insulating film.

Such a disadvantageous phenomenon is also observed during evaluation performed by using the Hg prober so that it is structurally difficult to reduce the transverse cross section of the mercury terminal functioning as the gate electrode of the MIS structure to a size proper to evaluate a gate insulating film on a 1.5-nm level.

SUMMARY OF THE INVENTION

It is therefore a primary object of the present invention to provide a method and apparatus for evaluating an insulating film which ensures, even if the insulating film such as a gate insulating film has been reduced in thickness, the detection of the time at which the insulating film breaks down by causing a measuring terminal for evaluating the insulating film for the characteristics or thickness thereof to function as the gate electrode of a MIS structure.

A method for evaluating an insulating film of the present invention is a method for evaluating an insulating film provided on a conductor layer in a substrate for characteristics or dimensions thereof, the method comprising the steps of: (a) disposing a measuring member having a plurality of conductor bumps and wires connected to the conductor bumps above the substrate, while placing the conductor bumps and the insulating film in opposing relation; (b) bringing the conductor bumps into contact with the insulating film and pressing the conductor bumps and the insulating film against each other with a given pressing force; and (c) applying an electric stress between the conductor bumps and the conductor layer and thereby evaluating the insulating film for the characteristics or dimensions thereof.

When the conductor bumps of the measuring member are pressed against the insulating film with the specified pressing force in accordance with the method, a nearly uniform contact area is provided between each of the conductor bumps and the insulating film. The use of the conductor bumps easily reduces the contact area between each of the conductor bumps and the insulating film to about 200 $\mu m^2$ or less, which is different from the conventional TDDB test performed by using a HG prober and a large-area MIS capacitor. As a result, the evaluation of a gate leakage current (I-V characteristic) in a gate insulating film reduced in thickness to, e.g., about 1.5 nm can be performed with high accuracy.

The step (c) can include evaluating the insulating film for a leakage characteristic thereof, for reliability thereof under the electric stress, for a current-voltage characteristic thereof, for a dielectric constant thereof, or for a thickness thereof.

The step (b) can include reducing a pressure in a space between the substrate and the measuring member and thereby relatively pressing the conductor bumps and the insulating film against each other. Even if a large number of conductor bumps are used, the method allows a nearly equal pressing force to be applied to each of the conductor bumps over the entire substrate.

The step (b) may include controlling the pressing force with which the conductor bumps and the insulating film are pressed against each other such that a contact area between each of the conductor bumps and the insulating film falls within a specified range, thereby allowing more accurate evaluation. The pressing force can also be controlled with a relative distance between the measuring member and the substrate.

The step (c) includes evaluating the insulating film, while heating at least one of the substrate and the measuring member, thereby adjusting the contact area resulting from the deformation of each of the conductor bumps to a proper value or allows an acceleration test to be performed on the characteristics of the insulating film.

The method for evaluating an insulating film of the present invention further comprises, prior to the step (a), the step of: (d) calibrating the pressing force to keep a contact area between each of the conductor bumps and the insulating film within a specified range, thereby increasing the reliability of evaluation.

The pressing force can be calibrated by using a second substrate having a second insulating film on a second conductor layer and bringing the conductor bumps of the measuring member into contact with the second insulating film or by evaluating the second insulating film for characteristics thereof including a leakage current.

The method for evaluating an insulating film of the present invention further comprises, after the step (c), the step of: (e) bringing the conductor bumps and the insulating film into a non-contact state and relatively moving the measuring member and the substrate, the procedure from the step (e) to the step (d) being repeated a plurality of times. The arrangement increases evaluation accuracy by performing evaluation at a large number of portions, while suppressing size variations by reducing the number of the conductor bumps.

The method for evaluating an insulating film of the present invention further comprises, prior to the step (a), the step of: (f) preparing a database individually storing respective sizes of the conductor bumps, wherein the step (c) includes retrieving, from the database, data on the respective sizes of the conductor bumps and evaluating the insulating film for the characteristics or dimensions thereof. The arrangement increases evaluation accuracy.

The method for evaluating an insulating film of the present invention further comprises, prior to the step (a), the step of: (g) predicting deformation of each of the conductor bumps in the step (b) based on data on respective sizes of the conductor bumps and preparing a database individually storing a contact area between each of the conductor bumps and the insulating film resulting from the deformation of each of the conductor bumps, wherein the step (c) includes retrieving, from the database, data on the contact area between each of the conductor bumps and the insulating film and evaluating the insulating film for the characteristics or dimensions thereof based on the contact area of each of the conductor bumps. The arrangement increases evaluation accuracy.

The step (g) preferably includes applying a pressing force between the measuring member and the substrate such that at least some of the plurality of conductor bumps are plastically deformed, measuring an area of an upper surface of each of the conductor bumps that have been plastically deformed after removing the pressing force, and predicting the deformation of each of the conductor bumps in the step (b) based on the area.

A first apparatus for evaluating an insulating film of the present invention is an apparatus for evaluating an insulating film provided on a conductor layer in a substrate for characteristics or dimensions thereof, the apparatus comprising: a measuring member having one or more conductor bumps and a wire connected to each of the conductor bumps, the measuring member being smaller in size than the substrate; and pressing-force adjusting means for adjusting a relative pressing force exerted on each of the conductor bumps and the insulating film such that the relative pressing force falls within a specified range.

The arrangement allows for evaluation to be performed only with respect to the insulating film on a part of the substrate so that the contact area between each of the conductor bumps and the insulating film is adjusted easily to be uniform and high evaluation accuracy is provided.

The apparatus for evaluating an insulating film of the present invention further comprises moving means for laterally moving the substrate or the measuring member, thereby allowing the insulating film on the entire substrate to be evaluated for the characteristics or dimensions thereof, while providing a uniform contact area between each of the conductor bumps and the insulating film.

The first apparatus for evaluating an insulating film of the present invention further comprises moving means for relatively rotating the substrate or the measuring member, thereby increasing evaluation accuracy by increasing the number of portions to be evaluated, while reducing variations in the sizes of the conductor bumps by reducing the number of conductor bumps.

By providing the pressing-force adjusting means with a mechanism for reducing a pressure in a space between the substrate and the measuring member, an equal relative pressing force is exerted on each of the conductor bumps and the insulating film uniform over the entire substrate.

Preferably, each of the conductor bumps is composed of a material having a lower hardness than the insulating film.

Preferably, a size of each of the conductor bumps is set such that a contact area between each of the conductor bumps and the insulating film resulting from the pressing force falls within a specified range.

The first apparatus for evaluating an insulating film of the present invention further comprises: a memory unit for individually storing a size of each of the conductor bumps; and an arithmetic operational unit for performing an arithmetic operation with respect to the characteristics or dimensions of the insulating film based on a size of each of the conductor bumps, which increases the evaluation accuracy of the apparatus for evaluating an insulating film.

A second apparatus for evaluating an insulating film of the present invention is an apparatus for evaluating an insulating film provided on a conductor layer in a substrate for characteristics thereof, the apparatus comprising: a measuring member having one or more conductor bumps, a wire connected to each of the conductor bumps, and a dummy bump which is not used to evaluate the insulating film for the characteristics thereof; and pressing-force adjusting means for adjusting a relative pressing force exerted on each of the conductor bumps and the insulating film such that the relative pressing force falls within a specified range.

In the arrangement, the pressing force applied to the measuring member is received by the conductor bumps and the dummy bumps so that variations in the pressing force applied to each of the conductor bumps are suppressed.

A third apparatus for evaluating an insulating film of the present invention is an apparatus for evaluating an insulating film provided on a semiconductor substrate for characteristics thereof, the apparatus comprising: a measuring member having at least one cantilever fixed at a proximal end thereof to have one or more conductor bumps mounted on a lower surface of a tip portion thereof and a wire connected to each of the conductor bumps; and pressing-force adjusting means for adjusting a relative pressing force exerted on each of the conductor bumps and the insulating film such that the relative pressing force falls within a specified range by controlling an amount of displacement of the cantilever.

The arrangement allows control of the relative vertical positional relationship between the bump support member and the substrate and allows proper adjustment of the relative pressing force which defines the contact area between each of the conductor bumps and the insulating film.

A fourth apparatus for evaluating an insulating film of the present invention is an apparatus for evaluating an insulating film provided on a conductor layer in a substrate for characteristics thereof, the apparatus comprising: a measuring member having one or more conductor bumps and a wire connected to each of the conductor bumps; a rod-like member supported rotatably at a proximal end thereof; amount-of-movement detecting means for detecting an amount of movement of a tip of the rod-like member along a surface of the insulating film; and pressing-force adjusting means for adjusting a pressing force exerted on each of the conductor bumps and the insulating film such that the pressing force falls within a specified range depending on a value detected by the amount-of-movement detecting means.

The arrangement allows control of the relative vertical positional relationship between the bump support member and the substrate and allows proper adjustment of the relative pressing force which defines the contact area between each of the conductor bumps and the insulating film.

The amount-of-movement detecting means optically detects the amount of movement of the tip of the rod-like member, which allows the pressing force to be controlled with a constantly high accuracy with a simple structure.

A fifth apparatus for evaluating an insulating film of the present invention is an apparatus for evaluating an insulating film provided on a semiconductor substrate for characteristics thereof, the apparatus comprising: a measuring member having one or more conductor bumps and a wire connected to each of the conductor bumps; pressing-force adjusting means for adjusting a relative pressing force exerted on each of the conductor bumps and the insulating film such that the relative pressing force falls within a specified range; and a substrate stage comprising a conductor projection for braking a portion of the insulating film on a back surface of the semiconductor substrate to come in contact with the back surface of the semiconductor substrate.

In the arrangement, the conductor projection breaks the portion of the insulating film on the back surface of the semiconductor substrate to come into contact with the back surface thereof so that substrate contact for transmitting an electric signal is obtained reliably without providing an extra step.

Preferably, the conductor projection is composed of a material containing at least one of rhenium, rhodium, nickel, tungsten, and tantalum.

BRIEF DESCRIPTION OF THE DRAWINGS

FIG. 1 is a view showing the known I-V characteristics of a thermal oxide film with a thickness of 1.5 nm provided on a p-type silicon substrate by using a gate area as a parameter.

FIG. 2 is a view showing the relationship of an apparatus for evaluating an insulting film by using conductor bumps and a method for evaluation in a known embodiment.

FIGS. 23A–C are views showing a structure of the apparatus for evaluating an insulating film which has the function of calibrating the pressing force in the seventh embodiment;

FIG. 26 is a view for illustrating the Hertz's law which describes the relations among the radius of a contact surface between two spheres when they are pressed against each other, a vertical force, an amount of approach, and the like;

DESCRIPTION OF THE PREFERRED EMBODIMENTS

Embodiment 1

Figure 3:
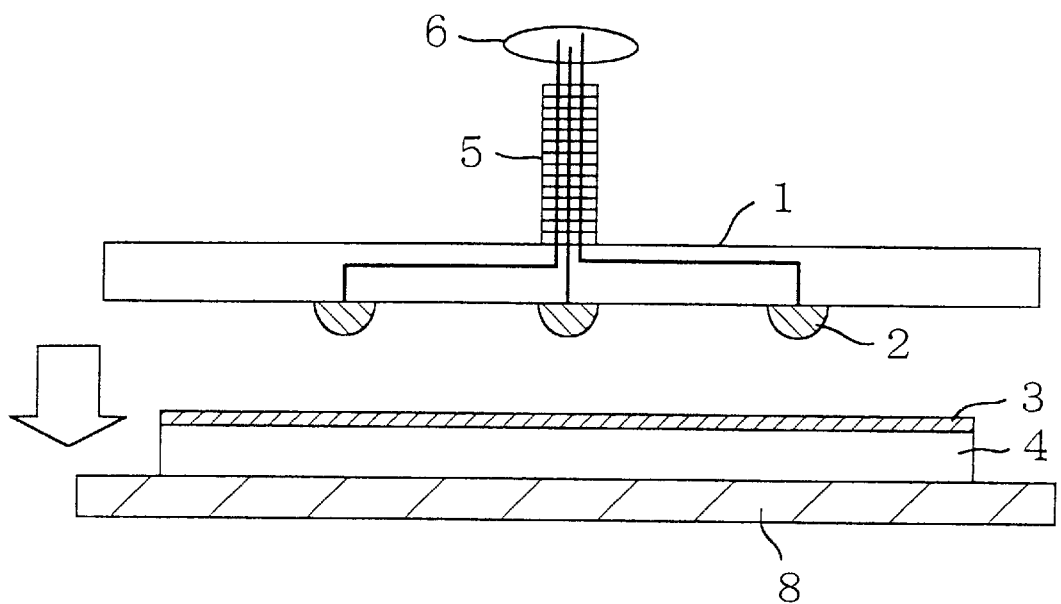
FIG. 3 is a cross-sectional view showing a structure of an apparatus for evaluating an insulating film by using conductor bumps and a method for evaluation in a first embodiment.

A description will be given first to a method and apparatus for evaluating an insulating film in a first embodiment of the present invention. FIG. 3 is a cross-sectional view illustrating a structure of the apparatus for evaluating the insulating film of the present embodiment in accordance with the method for evaluation of the present embodiment.

As shown in FIG. 3, a gate insulating film 3 composed of a silicon oxide film (thermal oxide film) provided on a silicon substrate 4 doped with a p-type impurity such that the who substrate functions as a conductor layer is an object to be measured. The silicon substrate 4 is placed on a wafer stage 8. A bump support member 1 as a measuring member is deposed above the silicon substrate 4. The lower surface of the bump support member us provided with numerous conductor bumps 2 protruding downwardly thereof The bump support member 1 is formed with wires 6 for providing electrical connections between the individual conductor bumps 2 and an externally located apparatus for measurement. The thickness of the gate insulating film 3 has been measured in advance by means of an ellipsometer to be, e.g., 2.4 nm. The conductor bumps 2 have been formed by a method of plating Ni grains with a metal having a lower hardness than the material composing the gate insulating film, such as Au.

When the gate insulating film 3 is evaluated, the bump support member 1 is lowered to bring the conductor bumps 2 into contact with the gate insulating film 3 and then the conductor bumps 2 are pressed against the gate insulating film 3 with a given pressing force P by means of a pressing mechanism 5. At this time, if the sizes and number of the conductor bumps 2 are determined, the contact area Sg between each of the conductor bumps 2 and the gate insulating film 3 is determined ideally in accordance with the Hertz's law, which will be described later. The relative pressing force P between each of the conductor bumps 2 and the gate insulating film 3 is adjusted by means of the pressing mechanism 5 such that the deformation of each of the conductor bumps 2 does not greatly exceed an elastic limit and that the contact area Sg between each of the conductor bumps 2 and the gate insulating film 3 falls within a specified range. What results is a MIS structure composed of the gate insulating film 3 interposed between the conductor bumps 2 and the silicon substrate 4. As the pressing mechanism 5, a mechanism for adjusting the pressing force to provide a uniform spacing between the gate insulating film 3 and the bump support member 1 (e.g., a mechanism for moving the bump support member 1 up and down by using a rotatable screw) is provided, though it is not depicted in FIG. 3.

The characteristics of the gate insulating film 3 can be evaluated by conducting the same test as the TDDB test and Hg prober test under this condition.

A description will be given next to a method for calculating an approximate contact area between each of the conductor bumps 2 and the gate insulating film 3 which corresponds to the gate area Sg of the MIS structure in the present embodiment.

Figure 26:
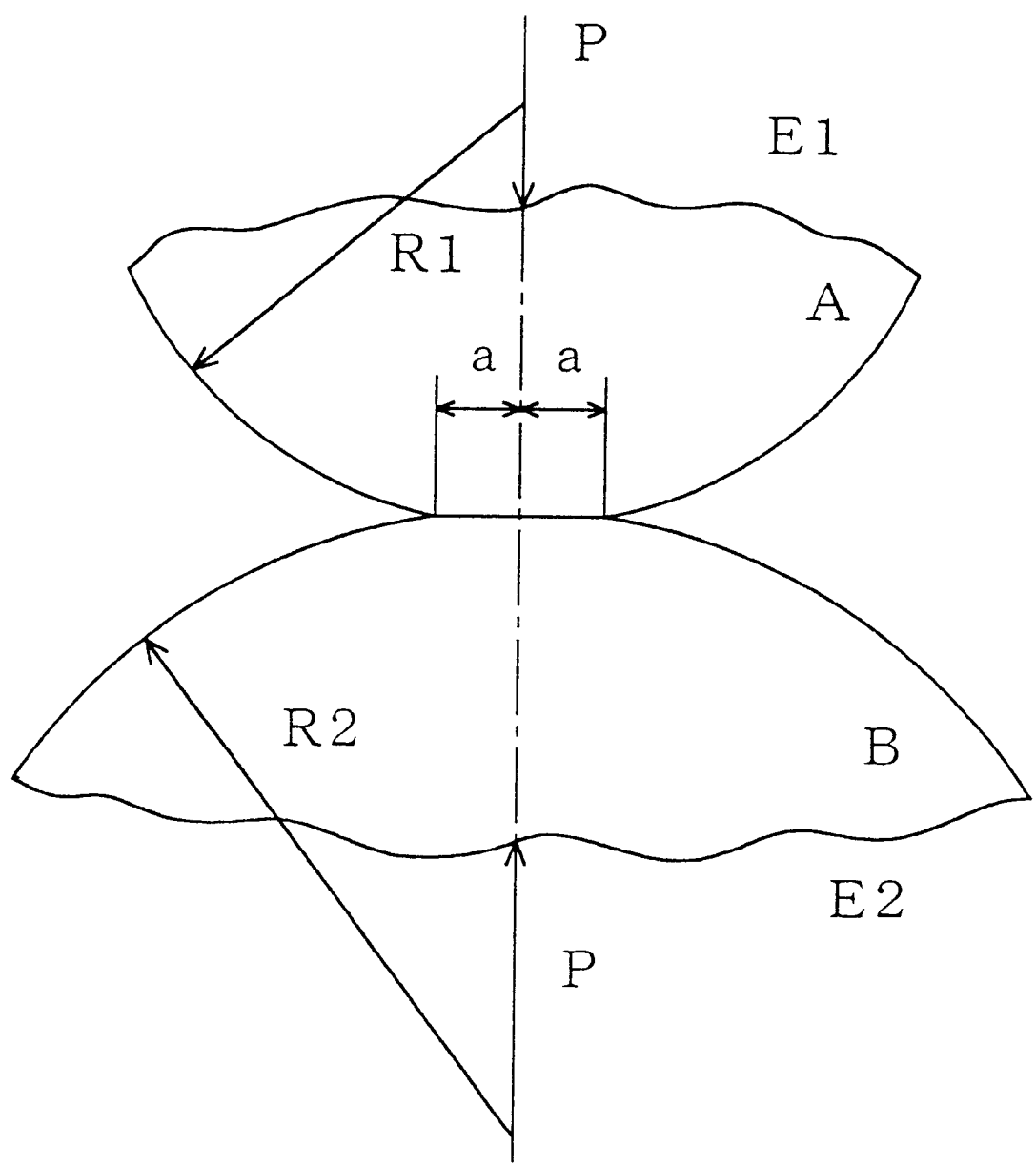

As shown in FIG. 26, the case is assumed where two spheres A and B having respective curvature radii R1 and R2 are pressed against each other under a vertical force (pressing force) P. It is assumed that the respective curvature radii of the two spheres A and B are R1 and R2 and the respective elastic ratios thereof are E1 and E2 and that each of the two spheres A and B has a Poisson's ratio of ν (=0.3). In this case, the radius a of the contact area between the two spheres A and B is given by the following expression (1) in accordance with the Hertz's law:

$$a = \sqrt[3]{[(3P/4) \cdot \{(1-v^2)/E1 + (1-v^2)/E2\}/(1/R1 + 1/R2)]} \quad (1).$$

If the curvature radius of each of the conductor bumps 2 is assumed to be R1, the curvature radius R2 becomes infinite because the gate insulating film 3 is a flat film in the present embodiment. Hence, the foregoing expression (1) is simplified into the following expression (2):

$$a = \sqrt[3]{[(3P/4) \cdot R1 \cdot \{(1-v^2)/E1 + (1-v^2)/E2\}]} \quad (2).$$

If the materials of the conductor bumps 2 and the insulating film 3 are determined, the elastic ratios E1 and E2 which are characteristics intrinsic to the materials are determined accordingly. If the vertical force P, i.e., the pressing force is determined, the contact area $\pi a^2$ corresponding to the gate area Sg is determined since the Poisson's ratio ν is generally 0.3. In practice, however, whether or not the contact area is proper can be judged through a comparison with the I-V characteristic of a MIS capacitor the area of which is known or based on a gate leakage current produced at a specific gate voltage. If the configuration of each of the conductor bumps 2 (the curvature radius of the tip thereof) is not necessarily uniform, such calibration is an easy and practical method.

The amount δ of approach shown in FIG. 26 is given by the following expression (3):

$$\delta = \sqrt[3]{[(9P^2/16) \cdot \{(1-v^2)/E1+(1-v^2)/E2\}^2/(1/R1+1/R2)]} \quad (3).$$

Although the foregoing expression (3) assumes that the deformation of the bumps is elastic deformation, even if the bumps undergo slight plastic deformation, the expression can be used approximately. It is also possible to determine the relationship between a load and the deformation of the bumps in accordance with a well-known method using the finite element method.

The TDDB test or the Hg prober test can be performed by applying the pressing force between the conductor bumps 2 and the gate insulating film 3 by using the foregoing MIS structure and measuring the I-V characteristic when the contact area Sg has a given value. In that case, it is easy to set the curvature radius of the tip of each of the bumps 2 and the pressing force such that the contact area Sg between the conductor bump and the gate insulating film falls within a preferable range shown in FIG. 2, e.g., within the range of 100 $\mu m^2$ or less. For the gate insulating film 3 having a thickness of about 1.5 nm also, it is possible to reliably detect the timing with which an abrupt change occurs in gate leakage current Ig, while measuring the I-V characteristic curve.

Thus, the method or apparatus for evaluation of the present embodiment allows for high-accuracy wafer-level evaluation of the characteristics of a gate insulating film configured as a thin film. If the method or apparatus for evaluation of the present embodiment is used for the TDDB test, in particular, the timing with which the gate leakage current Ig increases abruptly in I-V characteristic, i.e., the time at which the gate insulating film breaks down can be detected reliably, which allows for precise wafer-level estimation of the lifetime of the gate insulating film.

Figure 4:
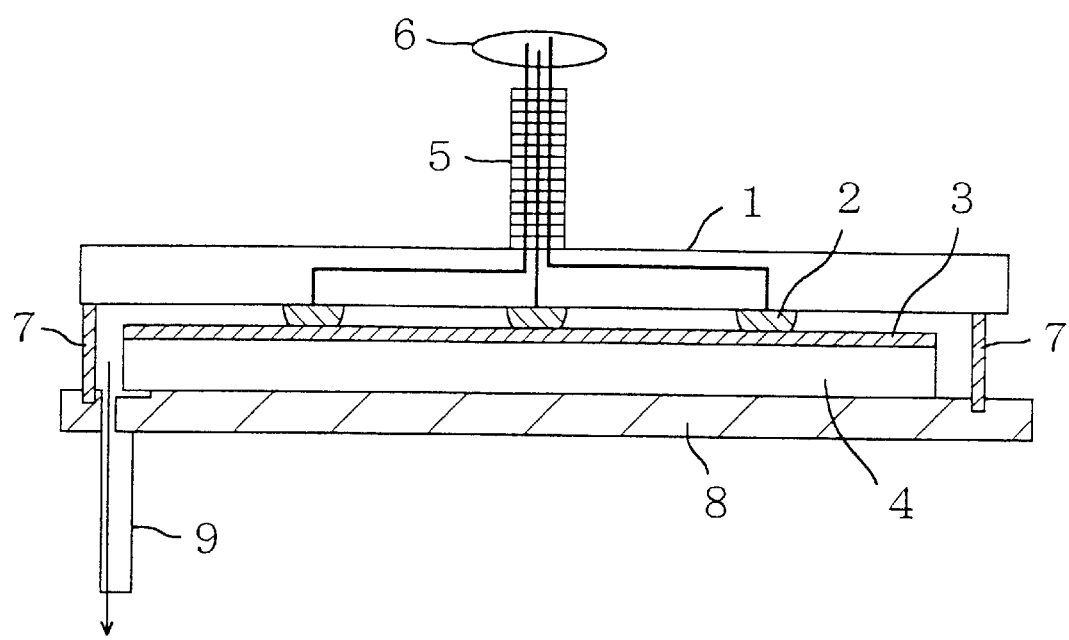
FIG. 4 is a cross-sectional view of an apparatus for evaluating an insulating film which includes an evacuating mechanism in a variation of the first embodiment.

FIG. 4 is a cross-sectional view showing a structure of an apparatus for evaluating an insulating film in a variation of the present embodiment. The apparatus for evaluation in the variation is basically the same as the structure shown in FIG. 3 in that it has the conductor bumps 2, the wires 6, and the pressing mechanism 5 but is different from the apparatus for evaluation of the first embodiment in that it further has an evacuating mechanism for reducing pressure in the space between the silicon substrate 4 and the bump support member 1. In this case, it is also possible to omit the pressing mechanism 5.

In FIG. 4, an O-ring 7 for shielding the space between the silicon substrate 4 and the bump support member 1 from an external space is interposed between the wafer stage 8 for carrying the silicon substrate 4 and the bump support member 1. Each of pipes 9 provided in several portions of the wafer stage 8 (of which only one is shown in FIG. 4) is connected to a vacuum pump (not shown). Since the pressing force of the bump support member 1 is determined by the degree of vacuum achieved by the vacuum pump, the contact area at the contact portion between each of the conductor bumps 2 and the gate insulating film 3 can be adjusted to a desired range in accordance with the degree of vacuum.

In this case, conductance in the space between the gate insulating film 3 and the bump support member 1 is high so that the provision of the pipes 9 for evacuation in several portions offers the advantage of providing a uniform contact area between each of the conductor bumps and the gate insulating film.

Figure 5:
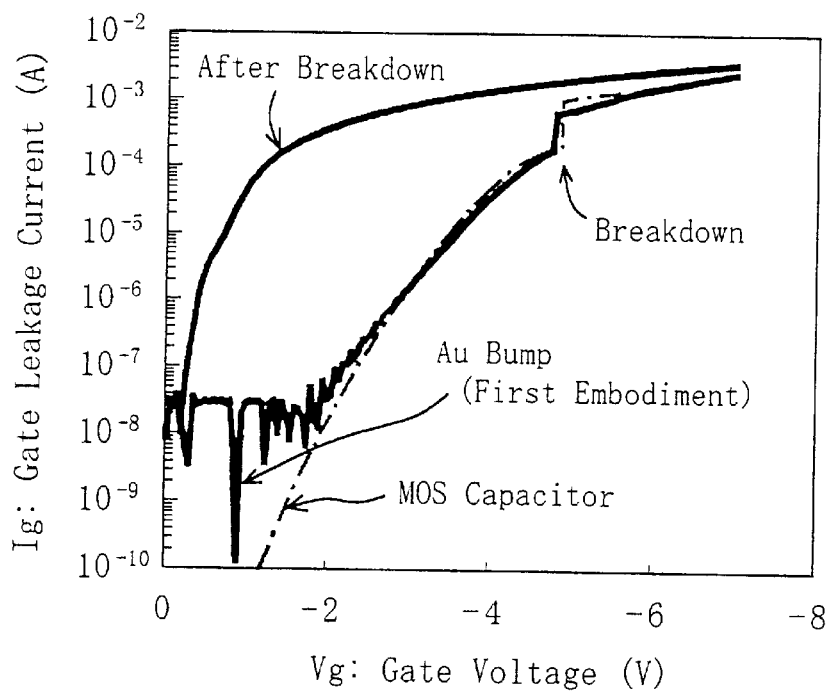
FIG. 5 is a view showing I-V characteristics obtained by using the apparatus for evaluation of the first embodiment.

FIG. 5 shows an I-V characteristic obtained as a result of measuring the gate leakage current Ig with the application of a voltage (gate voltage Vg) increasing gradually from zero between each of the conductor bumps 2 and the silicon substrate 4 by using the apparatus for evaluation in the present embodiment (variation). In the drawing, the horizontal axis represents the gate voltage Vg and the vertical axis represents the gate current (gate leakage current) Ig. The solid curves shown in the drawing represent actually measured data obtained in the present embodiment. As is observed in the drawing, an abrupt change in gate leakage current Ig indicative of the breakdown of the gate insulating film 3 shows the effectiveness of the method. It is to be noted that the apparatus for evaluation shown in FIG. 3 is different only in pressing mechanism from the variation and the same as the variation in that the MIS structure is composed of the gate insulating film 3 interposed between the conductor bumps 2 and the silicon substrate 4. Therefore, it is obvious that an I-V characteristic curve similar to that shown in FIG. 5 is also obtainable with the method and apparatus for evaluation shown in FIG. 3.

On the other hand, the broken curve shown in FIG. 5 indicates the I-V curve of a structure in which MIS capacitors are formed and isolated from each other such that each of the capacitors occupies an area of 200 $\mu m^2$. As can be seen from the drawing, the contact area between each of the conductor bumps 2 and the gate insulating film 3 is 200 $\mu m^2$ since the I-V characteristic curve measured in the present embodiment (variation) coincides with the I-V characteristic curve of each of the capacitors occupying the area of 200 $\mu m^2$. If it is difficult to determine the contact area between each of the conductor bumps 2 and the gate insulating film 3, additional MIS capacitors occupying several different areas are formed and the respective I-V characteristics of the MIS capacitors are examined. By examining which one of the I-V characteristic curves of the MIS transistors best matches the I-V characteristic curve obtained from the conductor bump 2 and the gate insulating film 3 as objects to be measured, the contact area between the conductor bump and the gate insulating film can be calibrated.

Figure 6:
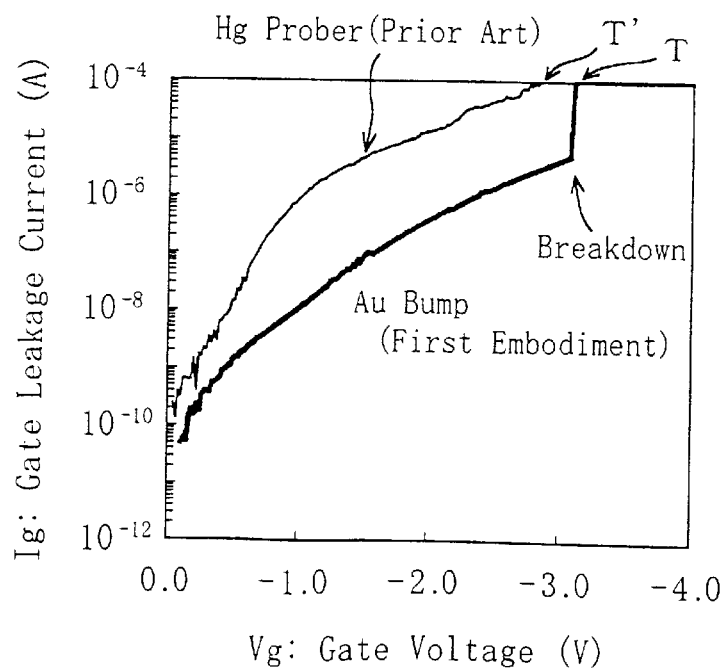
FIG. 6 is a view showing for comparison the I-V characteristic obtained by the method according to the first embodiment and an I-V characteristic obtained by a conventional Hg prober method.

FIG. 6 is a view showing for comparison the I-V characteristic obtained from the gate insulating film 3 with a thickness of 1.5 nm by the method according to the present embodiment and the I-V characteristic curve obtained from the gate insulating film 3 with a thickness of 1.5 nm by the conventional Hg prober method. In the I-V characteristic curve obtained by the conventional Hg prober method, an abrupt change in gate leakage current Ig in the gate insulating film with such an extremely small thickness cannot be recognized and the time at which the gate insulating film breaks down is unknown. That is, since the lateral cross-sectional area of a mercury terminal in the Hg prober method is about 0.01 $mm^2$ (10000 $\mu m^2$) as described above, the gate leakage current Ig before the gate insulating film breaks down is large to reach the value of the gate leakage current Ig after the breakdown of the gate insulating film (timing T' in FIG. 6) so that an abrupt change in gate leakage current does not appear in the I-V characteristic curve. By contrast, a distinct change in gate leakage current Ig (timing T) indicative of the time at which the gate insulating film breaks down is observed in the I-V characteristic curve obtained in accordance with the method for evaluation of the present embodiment, which indicates that the characteristics of the gate insulating film with a small thickness of about 1.5 nm can be evaluated reliably on the wafer level.

Embodiment 2

Figure 7:
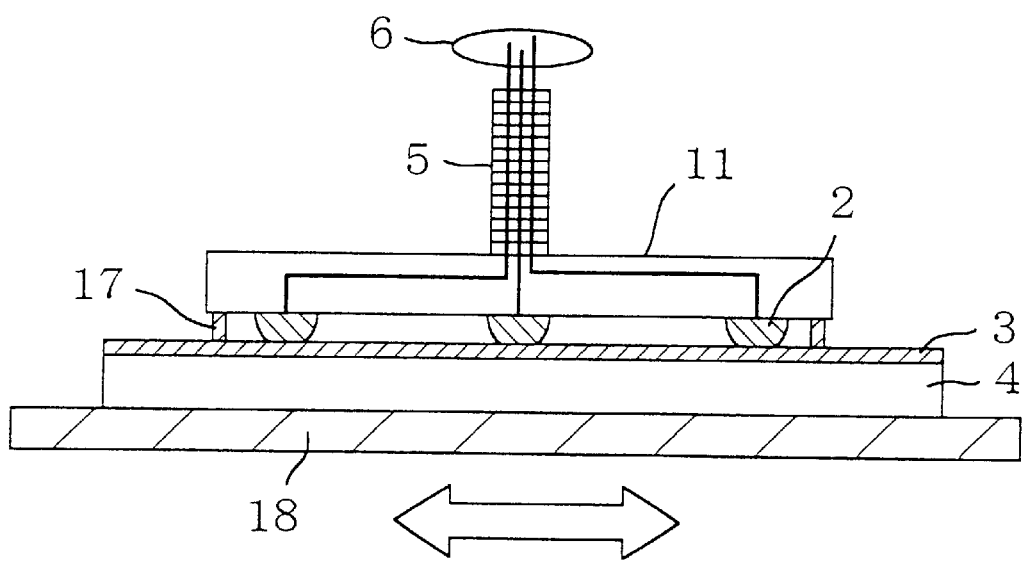
FIG. 7 is a cross-sectional view of an apparatus for evaluating an insulating film which includes a bump support member occupying an area smaller than that occupied by a wafer in a second embodiment.

FIG. 7 is a cross-sectional view showing a structure of an apparatus for evaluating an insulating film in a second embodiment.

In the present embodiment, the basic structure of the apparatus for evaluation is the same as in the first embodiment shown in FIG. 3 except that a bump support member 11 is smaller than the silicon substrate 4 (wafer) and, after an I-V characteristic and the like are evaluated by bringing the bump support member 11 into contact with a part of the gate insulating film 3 on the silicon substrate 4, the silicon substrate 4 is moved laterally by using a movable wafer stage 18 and an I-V characteristic is evaluated at another portion of the silicon substrate 4. In addition, an O-ring 17 is interposed between the bump support member 11 and the gate insulating film 3 such that pressure in the space between the bump support member 11 and the gate insulating film 3 is reduced by means of a pipe for evacuation and a vacuum pump (each of which is not shown) attached to the bump support member 11. As for the other members shown in FIG. 7, the description thereof is omitted by retaining the same reference numerals as used for the members of the apparatus for evaluation shown in FIG. 3. Although the three conductor bumps 2 are shown as examples in FIG. 7 showing calibration performed in the present embodiment, similarly to FIGS. 3 and 4 showing calibration performed in the first embodiment, the conductor bumps 2 provided in the present embodiment are generally smaller in number than in the first embodiment shown in FIGS. 3 and 4.

Since the wafer stage 19 is laterally movable and the bump support member 11 with the conductor bumps 2 arranged thereon is compact and smaller than the silicon substrate 4 in the present embodiment, it offers the advantage of allowing for evaluation of the entire gate insulating film 3 on the silicon substrate 4, while applying a steady and uniform pressing force to each of the conductor bumps 2.

Figure 8:
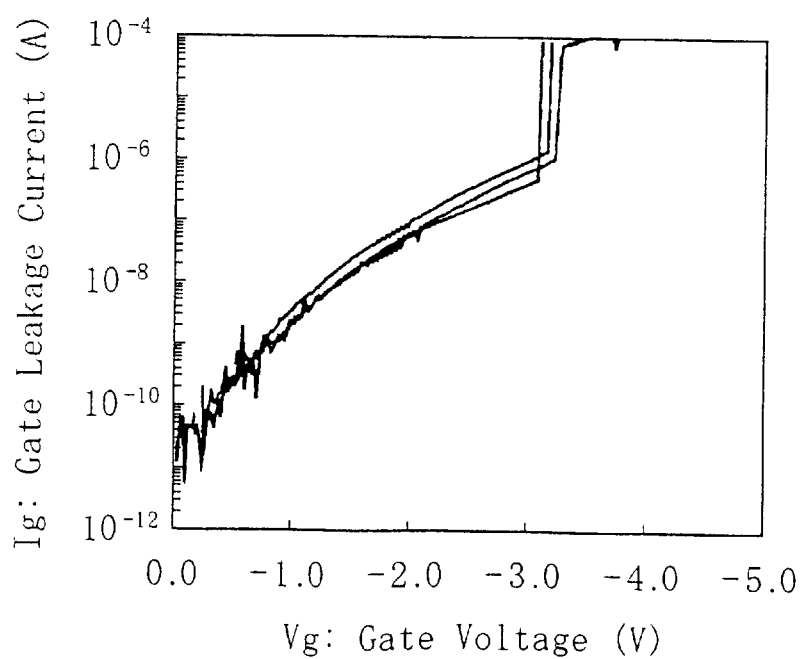
FIG. 8 is a view showing I-V characteristics obtained by using the apparatus for evaluation of the second embodiment.

FIG. 8 is a view showing I-V characteristics obtained as a result of measuring the gate leakage current Ig by applying a gate voltage Vg gradually increasing from zero in a MIS structure composed of the conductor bumps 2, the gate insulating film 3, and the silicon substrate 4 by means of the apparatus for evaluation of the present embodiment. In the drawing are shown three I-V characteristic curves obtained by individually measuring the regions around the center and periphery of the silicon substrate 4. As shown in the drawing, a variation in each of the I-V characteristic curves is small, which indicates that a nearly equal pressing force is applied to each of the conductor bumps 2.

Embodiment 3

Figure 9:
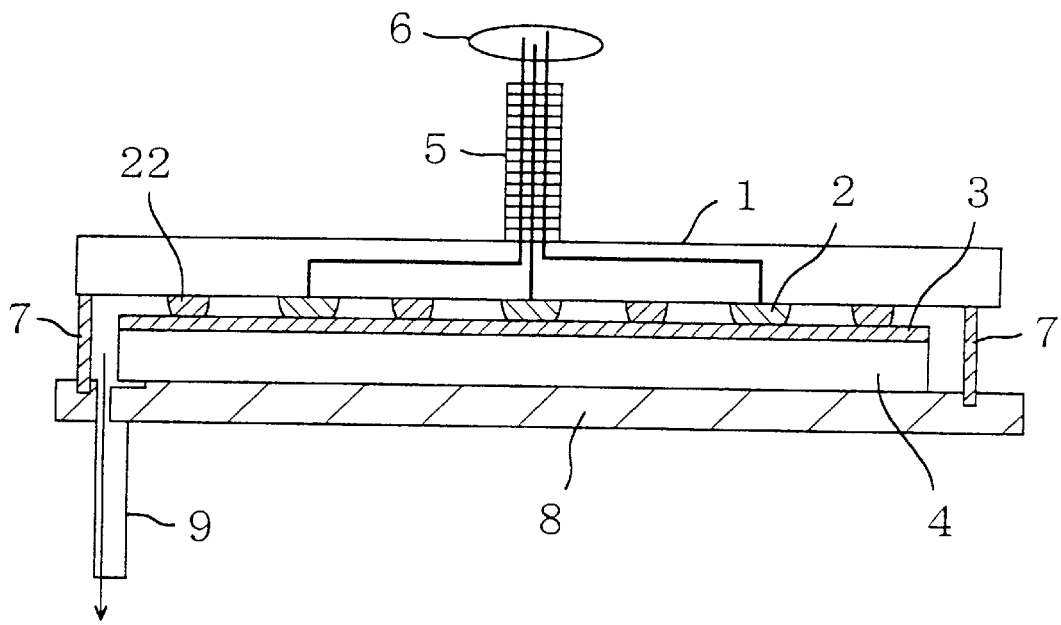
FIG. 9 is a cross-sectional view of an apparatus for evaluating an insulating film provided with dummy bumps in addition to the conductor bumps in a third embodiment.

FIG. 9 is a cross-sectional view showing a structure of an apparatus for evaluating an insulating film in a third embodiment.

The present embodiment is characterized in that, to the structure shown in FIG. 4, dummy bumps 22 composed of Au are provided additionally on the lower surface of the bump support member 1 provided with the bumps 2. The dummy bumps 22 are not connected to wires and not used for the measurement of I-V characteristics.

Since the dummy bumps 22 are disposed in conjunction with the conductor bumps 22 on the lower surface of the bump support member 1 in the present embodiment, a variation in pressing force exerted on each of the bumps 22 in response to a variation in pressure for evacuation is reduced, which offers the advantage of providing a constant and uniform contact area between each of the conductor bumps 2 and the gate insulating film 3. In addition, a variation in contact area with time responsive to the number of times the conductor bumps 2 are used can be reduced. Moreover, physical breakage of the gate insulating film 3 caused by excessive pressure locally applied can be circumvented in advance.

It is also possible to adjust, e.g., the height of each of the dummy bumps 22 to be slightly smaller than the height of each of the conductor bumps 2, stop the bump support member 1 from lowering when the gate insulating film 3 comes in contact with the dummy bumps 22 by utilizing the fact that a reacting force against the pressing force increases abruptly at the time of contact, and thereby allow the bump support member 1 to lower by a uniform amount (the amount δ of approach shown in the expression (3)) after the contact.

To provide a more stable pressure, it is preferred to provide the dummy bumps 22 which are larger in number than the conductor bumps 2. However, the dummy bumps 22 need not be composed of the same material as composing the conductor bumps 2 used for evaluation. The dummy bumps 22 may be composed of, e.g., a material having a higher elastic ratio than Au.

Figure 10:
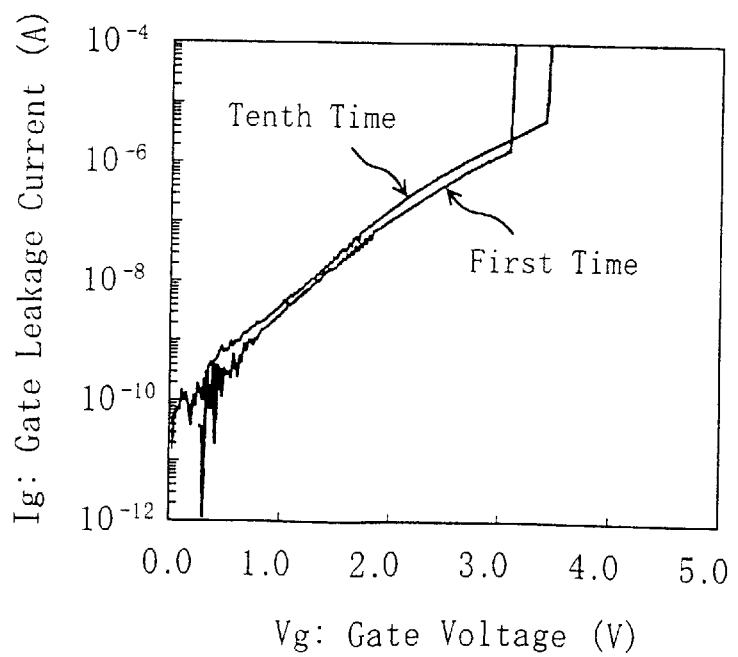
FIG. 10 is a view showing I-V characteristics obtained by using an apparatus for evaluation of the third embodiment.

FIG. 10 is a view showing I-V characteristic curves obtained as a result of applying a gate voltage Vg increasing gradually from zero in a MIS structure composed of the conductor bumps 2, the gate insulating film 3, and the silicon substrate 4 and measuring a gate leakage current Ig by using the apparatus for evaluation of the present embodiment. In the drawing are shown the I-V characteristic curves obtained as a result of the first and tenth measurements performed for the same conductor bump 2 after the procedure of pressing the conductor bump 2 against the near-center portion of the silicon substrate 4, measuring the I-V characteristic thereof, and removing the pressing force is repeated ten times. As can be seen from the drawing, reduced variations in the I-V characteristic curves obtained as a result of the first and tenth measurements indicate that the pressing force is applied again and again with a contact area by using the same conductor bump 2.

Thus, according to the present embodiment, the use of the dummy bumps 22 allows for stable measurement of the I-V characteristics and elongates the lifetime of the conductor bumps 2.

As a material composing the dummy bumps 22, not only Au but also various conductor materials or insulating materials can be used.

Embodiment 4

Figure 11:
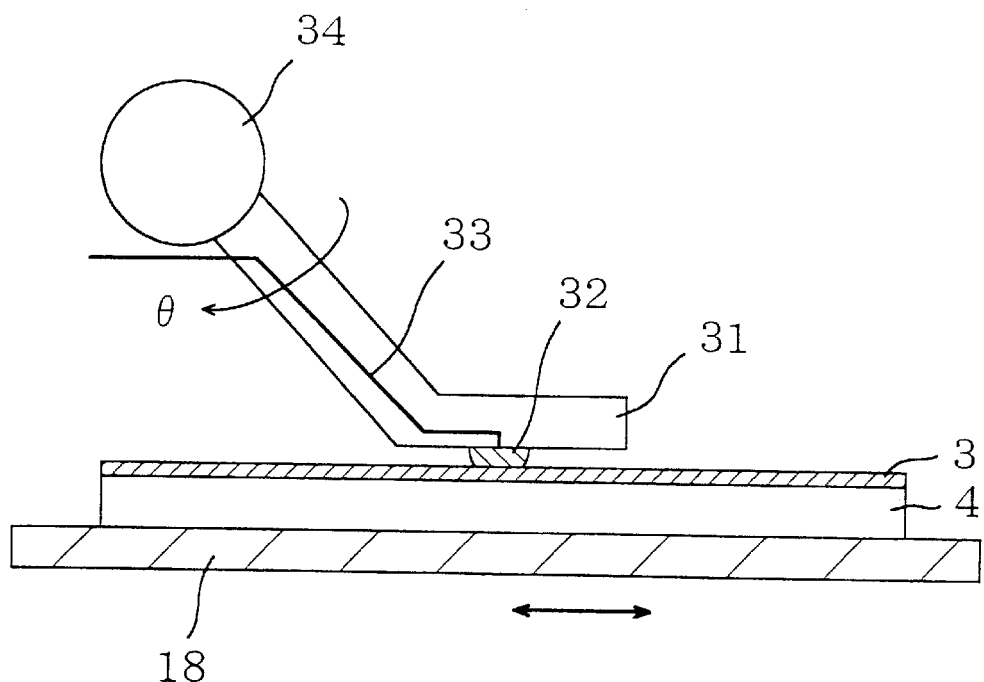
FIG. 11 is a cross-sectional view of an apparatus for evaluating an insulating film which includes a mechanism for controlling a pressing force using a cantilever-shaped support member in a fourth embodiment.

FIG. 11 is a cross-sectional view showing a structure of an apparatus for evaluating an insulating film in a fourth embodiment.

In the present embodiment, the silicon substrate 4 provided with the gate insulating film 3 is placed on the laterally movable wafer stage 18 and a cantilever-shaped support member 31 is disposed above the silicon substrate 4. The proximal end portion of the cantilever-shaped support member 31 is fixed, while a conductor bump 32 is provided on the lower surface of the tip portion of the support member 31 and connected to a wire 33. An extremely small torque system 34 provided with an additional sensor to adjust the bending angle θ of the cantilever-shaped support member 31 is disposed on the proximal end portion of the cantilever-shaped support member 31. The extremely small torque system 34 constitutes a pressing mechanism for pressing the conductor bump 32 against the gate insulating film 3.

In the present embodiment, a pressing force can be applied between the conductor bump 32 and the gate insulating film 3 by bending the cantilever-shaped support member 31 by means of the extremely small torque system 34, while detecting the pressing force between the conductor bump 32 and the gate insulating film 3 by means of the sensor. Since the pressing force between the conductor bump 32 and the gate insulating film 3 is in a one-to-one correspondence with a torque value shown by the extremely small torque system 34 detected by the sensor, it follows therefore that the pressing force corresponding to the vertical force P in the Hertz's law (1) described by using FIG. 26 is detected precisely. Thus, the present embodiment allows highly precise and highly reproducible evaluation of an insulating film, though the structure of the apparatus for evaluating an insulating film is complicated.

Figure 12:
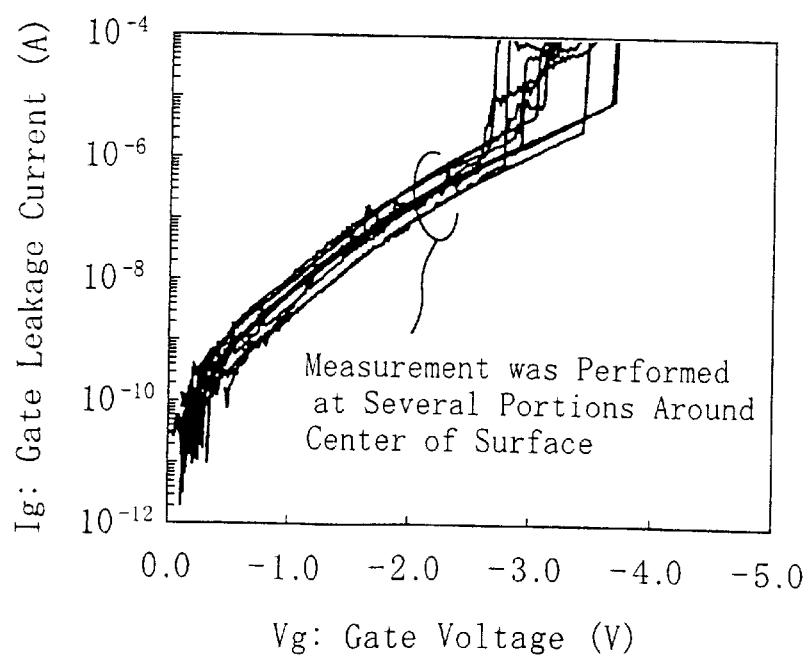
FIG. 12 is a view showing I-V characteristics obtained by using the apparatus for evaluation of the fourth embodiment.

FIG. 12 is a view showing I-V characteristic curves obtained as a result of applying a gate voltage Vg increasing gradually from zero in a MIS structure composed of the conductor bumps 2, the gate insulating film 3, and the silicon substrate 4 and measuring a gate leakage current Ig by using the apparatus for evaluation of the present embodiment. The I-V characteristic curves in FIG. 12 represent data obtained from a plurality of locations around the center of the silicon substrate 4. As can be seen from the drawing, stable I-V characteristics have been obtained if consideration is given to the fact that the thickness of the gate insulating film should vary among the locations at which the measurement was performed.

In the present embodiment, the pressing force can also be controlled by disposing a sensor for optically measuring the amount of rotation of the cantilever-shaped support member, instead of disposing the extremely small torque system.

A plurality of conductor bumps 2 may also be provided on the lower surface of a single cantilever-shaped support member 31 or, alternatively, a plurality of cantilever-shaped support member 31 may also be provided in a single apparatus for evaluating an insulating film.

Embodiment 5

Figure 13:
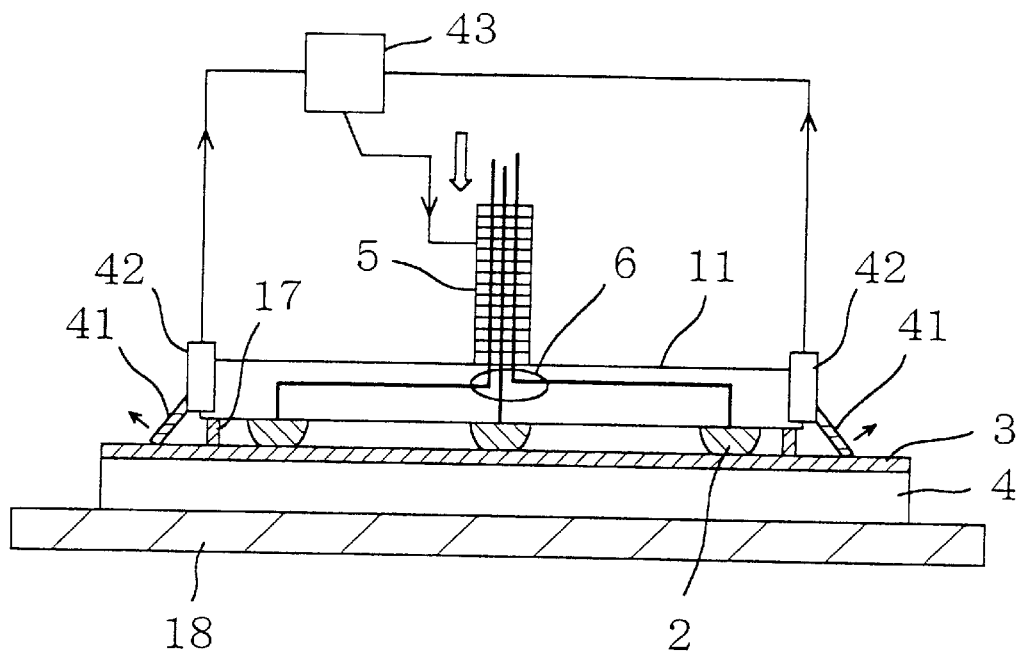
FIG. 13 is a cross-sectional view of an apparatus for evaluating an insulating film which includes a mechanism for controlling a pressing force using probe needles in a fifth embodiment.

FIG. 13 is a cross-sectional view showing a structure of an apparatus for evaluating an insulating film in a fifth embodiment.

In the present embodiment, probe needles 41 each supported rotatably at the proximal portion thereof and having a tip for contact with the gate insulating film 3, sensors 42 for detecting the amounts of rotation of the probe needles 41, and a control system 43 for controlling a pressing force P determined by the amounts of rotation of the probe needles 41 by means of a pressing mechanism 5 are provided additionally to the structure shown in FIG. 7. When the probe needles 41 are brought into contact with a surface of the gate insulating film 3 on the silicon substrate 4 as a result of lowering the bump support member 11, a signal indicative of the contact is transmitted by the sensors 42 to the control system 43 and the bump support member 11 is further lowered (overdriven) from the contact position by a specified distance (e.g., 1 μm). Since the distance covered by the overdriven bump support member 11 is a factor which determines the amount δ of approach in the expression (3), the pressing force P is controlled by controlling the distance covered by the overdriven bump support member 11. Therefore, the present embodiment controls the amount δ of approach described by using FIG. 26 such that the contact area (radius a of the contact portion) between each of the conductor bumps 2 and the gate insulating film falls within a desired range.

Figure 14:
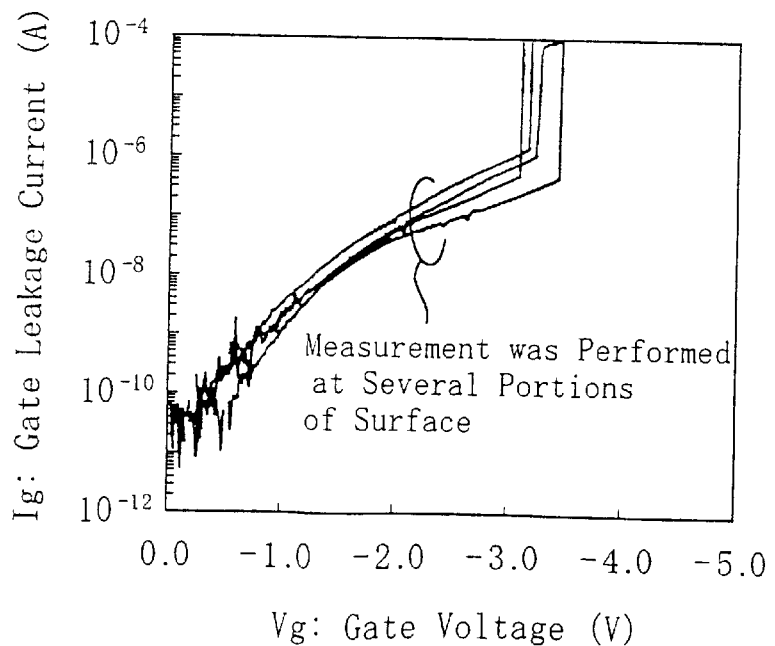
FIG. 14 is a view showing I-V characteristics obtained by using the apparatus for evaluation of the fifth embodiment.

FIG. 14 is a view showing I-V characteristic curves obtained as a result of applying a gate voltage Vg increasing gradually from zero in a MIS structure composed of the conductor bumps 2, the gate insulating film 3, and the silicon substrate 4 and thereby measuring a gate leakage current Ig by using the apparatus for evaluation of the present embodiment. The I-V characteristic curves in FIG. 14 show data obtained from a plurality of portions of the silicon substrate 4. As can be seen from the drawing, the I-V characteristics with reduced variations have been achieved by controlling the amount of overdriving such that it is nearly constant.

Figure 15:
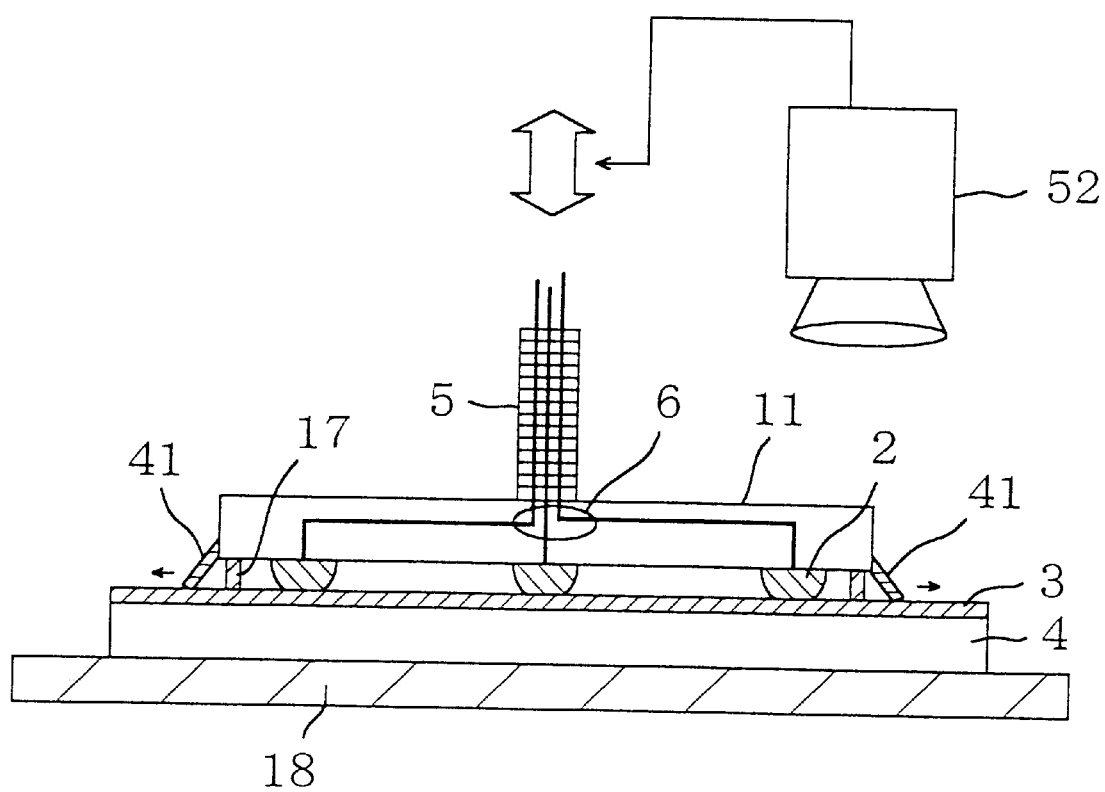
FIG. 15 is a cross-sectional view of an apparatus for evaluating an insulating film which includes a mechanism for controlling a pressing force using the probe needle and an optical detecting mechanism in a variation of the fifth embodiment.

FIG. 15 is a view showing a structure of an apparatus for evaluating an insulating film in a variation of the present embodiment. In the example, the timing with which the probe needles 41 move laterally as a result of lowering the bump support member 11 is detected by observation using a microscope 52 and the time at which the probe needles 41 move laterally is judged to be the time at which the probe needles 41 come into contact with the gate insulating film 3. Thereafter, the tips of the probe needles 41 are observed by using the microscope 52 and the bump support member 11 is lowered (overdriven) till the probe needles move laterally by a nearly fixed amount such that the amount δ of approach (i.e., the pressing force P) between each of the conductor bumps 2 and the gate insulating film 3 falls within a specified range. In this case, the amount of overdriving is controlled based on a visual judgment made by a measurer. However, equal effects as achieved in the case of using the apparatus shown in FIG. 13 have been achieved.

Embodiment 6

Figure 16:
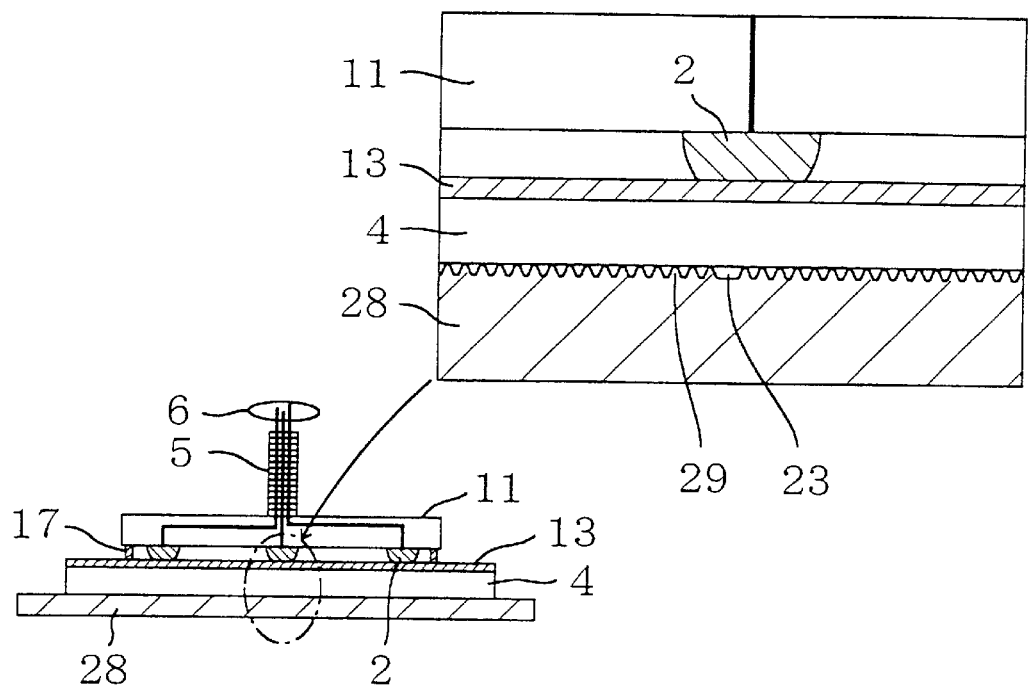
FIG. 16 is a cross-sectional view of an apparatus for evaluating an insulating film which includes a mechanism for braking the portion of the insulating film on a back surface of a wafer in a sixth embodiment.

FIG. 16 is a cross-sectional view showing a structure of an apparatus for evaluating an insulating film in a sixth embodiment.

In the present embodiment, a surface of a wafer stage 28 composed of a high-hardness metal such as molybdenum or tungsten has projections 29 as conductor projections for contact with a back surface of the silicon substrate 4 by braking down the insulating film on the back surface of the silicon substrate 4, which are provided additionally to the structure shown in FIG. 7. In the present embodiment, however, the gate insulating film 13 composed of a silicon nitride film with a thickness of about 4 nm formed on the silicon substrate 4 is used as an object to be evaluated. Although the back surface of the silicon substrate 4 is also formed with a silicon nitride film 23, an electric connection is provided between the wafer stage 28 and the silicon substrate 4 since the silicon nitride film 23 is broken by the projections 29 when the bump support member 11 is lowered and pressed against the silicon substrate 4 by means of the pressing mechanism 5 with the silicon substrate 4 being placed on the wafer stage 28.

Conventionally, there are cases where a natural oxide film is formed on a back surface of a silicon substrate or a compound semiconductor substrate, while an insulating film being formed on a principal surface of the substrate is formed partly or entirely on the back surface thereof. To achieve back-surface contact necessary to evaluate the characteristics of the insulating film on the substrate as in the present embodiment, an extra step of grading a part of the back surface of the substrate or the like is required. However, since the present embodiment has composed the wafer stage 28 of a high-hardness conductor material and provided the projections 29 on the surface thereof, the insulating film such as the silicon nitride film 23 or the like on the back surface of the silicon substrate 4 can be broken by using a force when a relative pressing force is applied between each of the conductor bumps 2 and the gate insulating film 3. This makes it possible to provide an electric connection between the back surface of the silicon substrate 4 and the wafer stage 28 without particularly performing an extra step.

Figure 17:
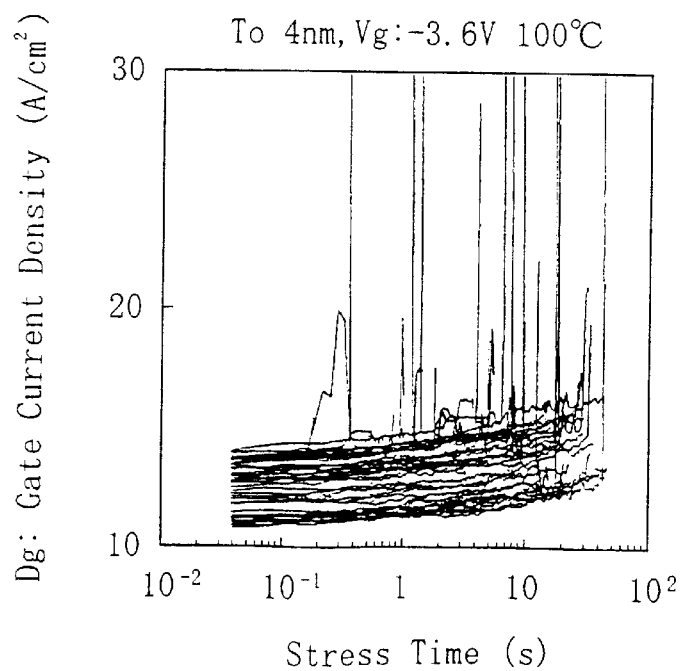
FIG. 17 is a view showing I-V characteristics obtained by using the apparatus for evaluation of the sixth embodiment.

FIG. 17 is a view showing time-varying characteristics of a gate current density Dg obtained as a result of applying a gate voltage Vg of −3.6 V in a MIS structure composed of the conductor bumps 2, the gate insulating film 13 (silicon nitride film), and the silicon substrate 4 and thereby measuring the gate leakage current density Dg by using the apparatus for evaluation of the present embodiment. In the drawing, the horizontal axis represents an elapsed time (s) from the application of the gate voltage Vg and the vertical axis represents the gate leakage current density Dg (A/cm$^2$) The data shown in the drawing is obtained as a result of performing an acceleration test, while adjusting the substrate temperature to 100° C. by providing a mechanism for heating the substrate (such as a heater 61 shown in FIG. 24). As can be seen from the drawing, variations in gate leakage current density Dg are small so that back-surface contact is provided constantly irrespective of a large thickness of the gate insulating film 13. Therefore, the use of the present embodiment allows easy evaluation of the characteristics of an insulating film with a high dielectric constant.

Figure 18:
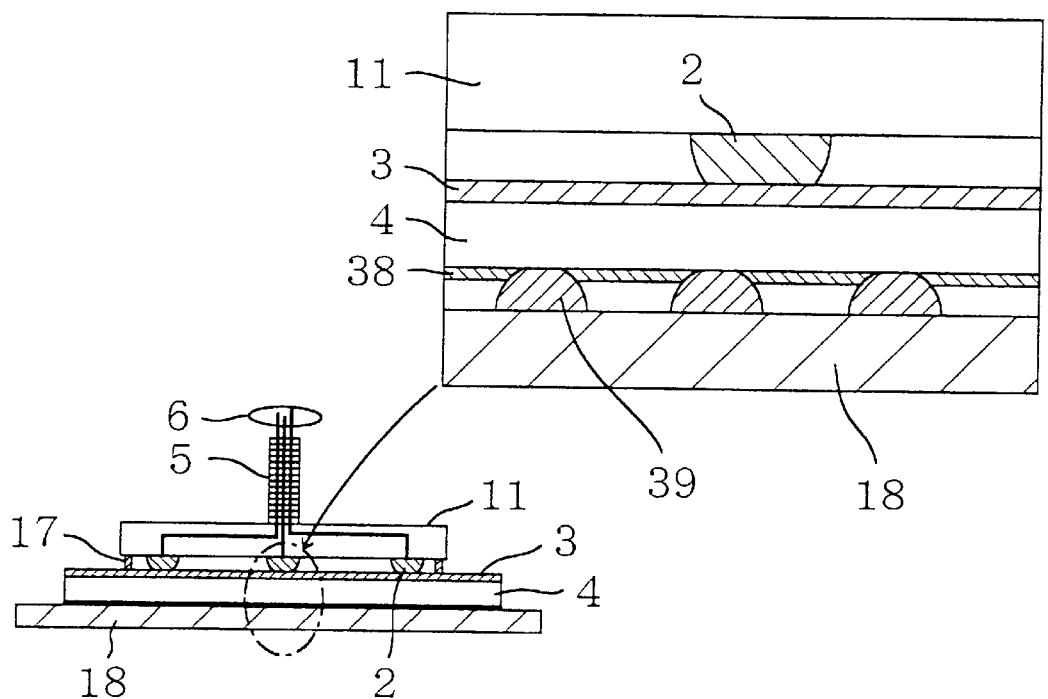
FIG. 18 is a cross-sectional view of an apparatus for evaluating an insulating film which includes a mechanism for braking the portion of the insulating film on a back surface of a wafer in a variation of the sixth embodiment.

FIG. 18 is a view showing a structure of an apparatus for evaluating an insulating film in a variation of the present embodiment. In the variation, conductor projecting members 39 composed of a conductor with a high hardness such as rhodium (Rh) are provided on the wafer stage 18 composed of a low-resistance metal having a relatively low hardness such as an aluminum alloy or a copper alloy. In the present variation, however, the gate insulating film 3 composed of a silicon oxide film with a thickness of about 2.4 nm formed on the silicon substrate 4 is used as an object to be evaluated. It will easily be appreciated that the same effect achieved in the case of using the apparatus for evaluation having the structure shown in FIG. 16 is also achievable in the variation. In the case of composing the wafer stage 18 of an insulating material, a wire for providing a connection between each of the conductor projecting members 39 and an external apparatus for measurement is provided appropriately.

Figure 19:
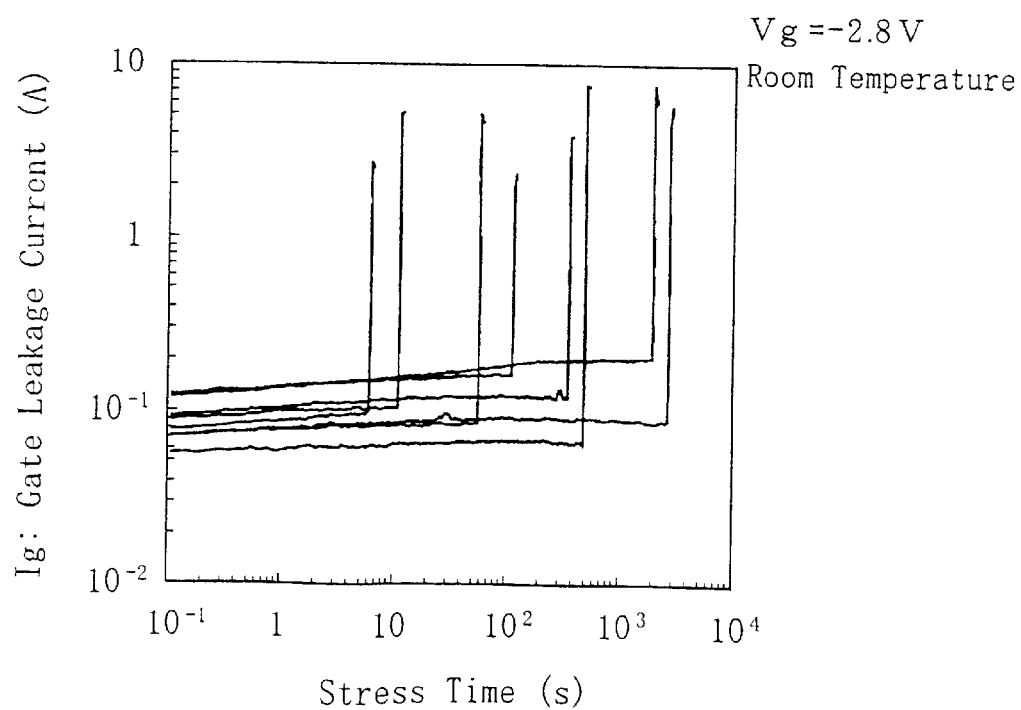
FIG. 19 is a view showing I-V characteristics obtained by using the apparatus for evaluation in the variation of the sixth embodiment.

FIG. 19 is a view showing data obtained as a result of applying a gate voltage Vg of −2.8 V in a MIS structure composed of the conductor bumps 2, the gate insulating film 3 (silicon oxide film), and the silicon substrate 4 and thereby performing a TDDB test by using the apparatus for evaluation of the variation of the present embodiment. In the drawing, the horizontal axis represents an elapsed time (s) from the application of the gate voltage Vg and the vertical axis represents a gate leakage current (A). The time at which the gate leakage current Ig increases abruptly in the drawing is the time at which the gate insulating film breaks down. As can be seen from the drawing, the TDDB test can be performed under the condition with reduced variations in gate leakage current Ig.

The projections 29 of the present embodiment and the conductor projecting portions 39 of the variation thereof should be composed of a conductor material having a sufficient hardness or strength to cause the breakdown of an insulating film such as a silicon oxide film or a silicon nitride film which are formed readily on the back surface of the silicon substrate 4. Even though the projections 29 and the conductor projecting members 39 have a hardness lower than that of the silicon oxide film or the silicon nitride film, the effects achieved in the present embodiment or the variation thereof are achievable because they can cause the breakdown of the insulating film such as a thin oxide or nitride film if the projections 29 and the conductor projecting members 39 are composed of a stiff material.

Example of such a conductor material with a high hardness or strength include tungsten (W), molybdenum (Mo), rhenium (Re), ruthenium (Ru), rhodium (Rh), silicon carbide (SiC), tungsten carbide (WC) (semiconductor), titanium carbide (TiC) (metalloid), tantalum carbide (TaC) (metal), and boron carbide (B4C), any of which may be used.

Embodiment 7

Figure 20:
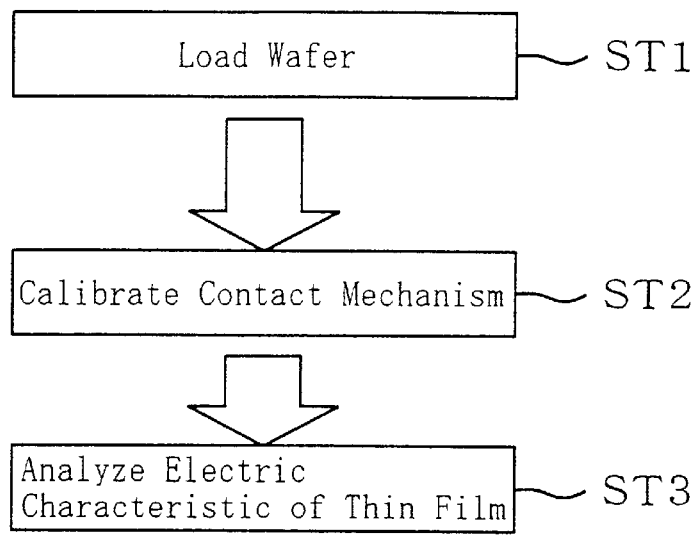
FIG. 20 is a flow chart schematically showing the procedure of a method for evaluating an insulating film including the calibration of a pressing force in a seventh embodiment.

FIG. 20 is a flow chart schematically showing the procedure of a method for evaluating an insulating film in a seventh embodiment.

First, in Step ST1, a wafer with an insulating film as an object to be measured (such as the silicon substrate 4 provided with the gate insulating film 3 composed of a silicon oxide film shown in FIG. 3) is placed on a wafer stage such that a pressing force is applied between each of the conductive bumps and the insulating film (loading of the wafer).

Next, in Step ST2, the pressing force is calibrated such that a contact area between each of the conductor bumps and the gate insulating film falls within a specified range. As will be described later, the calibration is performed by examining whether or not a gate leakage current caused when a specified gate voltage is applied with the application of a given pressing force falls within the range of the gate leakage current if a gate area (contact area) in a MIS structure under the present test is assumed to be in a proper range. Thereafter, in Step ST3, the leakage characteristic of the insulating film and an electric characteristic thereof, such as TDDB, are analyzed.

A description will be given next to a method for calibrating the pressing force between each of the conductor bumps and the gate insulating film in Step ST2 described above. The present embodiment has used, as a sample for calibration, a silicon wafer provided with a thermal oxide film (silicon oxide film) with a thickness of 4 nm. The range of the gate leakage current Ig (e.g., 1 $\mu$A to 10 $\mu$A) which corresponds to a proper contact area and flows through the thermal oxide film when the gate voltage Vg applied to the conductor bumps is −6 V has been determined preliminarily.

Figure 22:
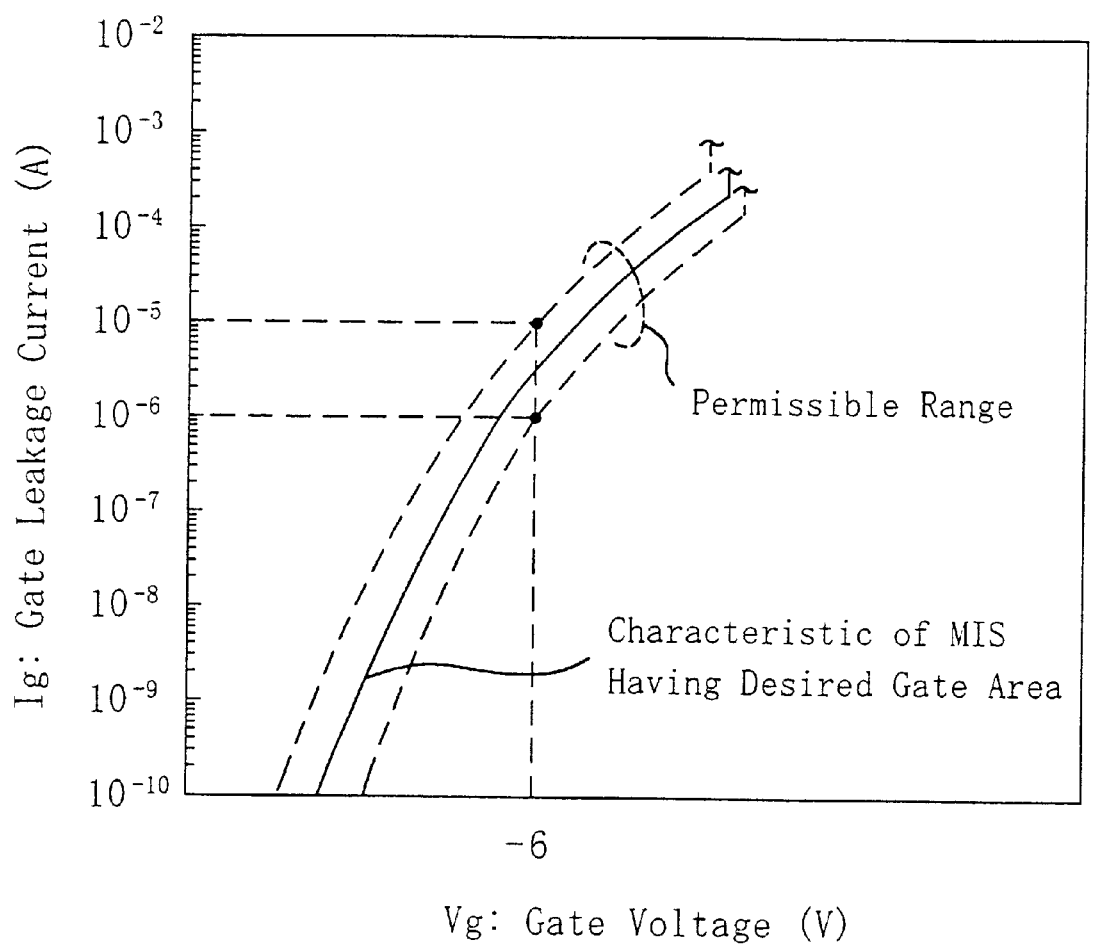
FIG. 22 is a view showing a value of a gate leakage current used as a reference in calibrating the pressing force to obtain a proper contact area in the seventh embodiment.

FIG. 22 is a view showing values of a gate leakage current serving as references when the pressing force P is calibrated to provide the proper contact area between each of the conductor bumps and the gate insulating film. For example, it is assumed that, as shown in FIG. 22, the I-V characteristic of a MIS structure having a gate insulating film composed of a thermal oxide film with a thickness of 4 nm and a gate area coincident with a contact area desired in the present embodiment has been obtained as indicated by the solid line in the drawing. In addition to the I-V characteristic indicated by the solid line, I-V characteristics (indicated by the broken curves in the drawing) when the gate area deviates by, e.g., ±10% from the desired value are measured such that the solid line is located halfway between the broken lines. If an I-V characteristic obtained falls within a range defined by the broken lines, it is judged that the contact area between each of the conductor bumps and the gate insulating film falls within a proper specified range (permissible range).

However, since the measurement of the I-V characteristic during calibration requires an extra step, if the gate leakage current Ig caused for each of the conductor bumps at the specified gate voltage (in the example, −6 V) is between the lower-limit value (in this example, 10$^{-6}$ A) and upper-limit value (in this example, 10$^{-5}$ A) of the permissible range, it can be judged that the contact area between each of the conductor bumps and the gate insulating film is proper.

FIGS. 23A to 23C are cross-sectional views illustrating the procedure of calibrating the pressing force by using the apparatus for evaluating an insulating film having the function of calibrating a pressing force in the present embodiment.

As shown in FIG. 23A, a system for analyzing a leakage current in a wafer with a standard thermal oxide film has been incorporated into the apparatus for evaluating an insulating film of the present embodiment. Specifically, the present embodiment comprises a height adjusting mechanism 55, a current measuring system 56, a height control system 57, and a pressure sensor 60 in addition to the apparatus for evaluating an insulating film shown in FIG. 4. A monitor wafer 58 having a standard thermal oxide film 3 with a thickness of 4 nm formed on a surface thereof has been placed as a standard sample. It is assumed that the standard thermal oxide film 57 has the I-V characteristic shown in FIG. 22.

First, as shown in FIG. 23A, the monitor wafer 59 is placed on the wafer stage 8 of the apparatus for evaluation. The system for analyzing the leakage current in the silicon substrate formed with the thermal oxide film having the I-V characteristic shown in FIG. 22 and a thickness of 4 nm has been incorporated into the apparatus for evaluating an insulating film of the present embodiment shown in FIG. 23A. If it is assumed that the contact area is determined by the radius a and the curvature radius is constant as can be seen from the Hertz's law shown in FIG. 26, the radius a is determined by the pressing force P. Therefore, the pressing force P which provides a proper contact area should be obtained by calibration based on the value of a current flowing through each of the bumps. Accordingly, the pressing force P with which the gate leakage current Ig when a gate voltage of −6 V is applied becomes 5 $\mu$A is set to zero as a basic value and the lower-limit value of 1 $\mu$A and the upper-limit value of 10 $\mu$A are set over and under 5 $\mu$A.

As shown in FIG. 23B, the bump support member 1 is lowered and the space between the bump support member 1 and the wafer stage 8 is evacuated by means of an evacuating mechanism such as a vacuum pump, while the O-ring 7 and the wafer stage 8 are kept in contact. At this time, the pressure is detected by a pressure sensor 60, whereby the pressing force P per bump is calculated. The gate leakage current Ig is measured with a gate voltage Vg of −6 V being applied to the conductor bumps, while the current flowing through each of the bumps 2 is measured by means of the current measuring system 56 and a relative pressing force is applied to the conductor bumps and the gate insulating film such that the pressing force when the gate leakage current Ig reaches a standard value (5 $\mu$A) is detected as a basic pressing force Pst. If there are a plurality of bumps, however, the configurations thereof should not be precisely the same so that variations are normally produced in the gate leakage currents Ig flowing through the respective bumps when the gate voltage of −6 V is applied. Accordingly, the pressing force P when the difference between the minimum value of the gate leakage current Ig actually measured and the lower-limit value (1 $\mu$A) of the permissible range is equal to the difference between the maximum value of the gate leakage current Ig actually measured and the upper-limit value (10 $\mu$A) of the permissible range is designated as the basic pressing force Pst. If the gate leakage current in any of the conductor bumps does not fall within the permissible range by any means, it is judged that the bump support member cannot be used. However, it is also possible to perform calibration after correcting the tilt of the bump support member or the like.

Next, as shown in FIG. 23C, the silicon substrate 4 having the gate insulating film 3 as an object to be measured formed on a surface thereof is placed on the wafer stage 8 as a replacement for the monitor wafer and the space between the bump support member 1 and the wafer stage 8 is evacuated. At this time, evacuation is continued till the pressure in the space between the bump support member 1 and the wafer stage 8 detected by the pressure sensor 60 reaches a value corresponding to the basic pressing force Pst obtained by calibration in the step shown in FIG. 23B.

The method described above is applicable to each of the foregoing embodiments which comprise evacuating mechanisms. However, the foregoing method cannot directly calibrate the pressing force to a proper value in an apparatus which has only a mechanism for controlling the relative vertical positional relationship between the bump support member and the wafer and does not have a mechanism for controlling the pressure itself of the evacuating mechanism or the like as used in, e.g., the first embodiment (see FIG. 3).

A description will be given below to the procedure of indirectly calibrating the pressing force P by calibrating the amount of lowering of the bump support member instead of directly calibrating the pressing force P. In calibrating the pressing force P, this example uses, as a standard for judgment, the relative vertical positional relationship between the bump support member and the wafer stage (the amount $\delta$ of approach shown in FIG. 26). If it is assumed that the contact area is determined by the radius a and the curvature radius is constant as can be seen from the Hertz's law shown in FIG. 26, the radius a is determined by the pressing force P. On the other hand, the pressing force P can be calculated from the amount 6 of approach by using the relative relationship between the pressing force P and the amount $\delta$ of approach given by the expression (3). Accordingly, the pressing force P can be calibrated indirectly by calibrating the amount of lowering of the bump support member (i.e., the amount $\delta$ of approach) from the position at which the conductor bumps are brought into contact with the gate insulating film.

Specifically, the amount of lowering with which the gate leakage current Ig when a gate voltage of −6 V is applied becomes 5 $\mu$A is set to a basic zero position and the lower-limit value of 1 $\mu$A and the upper-limit value of 10 $\mu$A are set over and under 5 $\mu$A. The gate leakage current Ig is measured with a gate voltage Vg of −6 V being applied to the conductor bumps and the distance (the amount $\delta$ of approach) covered by the bump support member that has been lowered from the position at which the conductor bumps are brought into contact with the gate insulating film till the gate leakage current Ig reaches the standard value (5 $\mu$A) is calculated as a basic amount $\delta$st of lowering. If there are a plurality of conductor bumps, however, the configurations thereof should not be precisely the same so that variations are normally produced in the gate leakage currents Ig flowing through the respective conductor bumps. Accordingly, the amount of lowering when the difference between the minimum value of the gate leakage current Ig actually measured and the lower-limit value (1 $\mu$A) of the permissible range is equal to the difference between the maximum value of the gate leakage current Ig actually measured and the upper-limit value (10 $\mu$A) of the permissible range is designated as the basic amount $\delta$st of lowering.

At the time of actual measurement in Step ST3, the bump support member is lowered from the position at which the conductor bumps of the bump support member are brought into contact with the gate insulating film on the silicon substrate as an object to be measured by the basic amount $\delta$st of lowering determined through the calibration and the gate voltage Vg for testing (which need not be −6 V) for testing is applied to the conductor bumps at the lower position.

Since the calibration of the pressing force P is only a process for providing a proper contact area (gate area) between each of the conductor bumps and the gate insulating film in each of the method for directly calibrating the pressing force and the method for indirectly calibrating the pressing force that have been described above, it is not necessary for the material and thickness of the gate insulating film for actual measurement to be coincident with the material and thickness of the thermal oxide film used for calibration.

To check the lifetime and accuracy of the conductor bumps, it is also possible to use a monitor wafer having the aforementioned thermal oxide film. For example, it is judged that the bumps are usable if the gate leakage current Ig produced in each of the conductor bumps when a gate voltage Vg of −6 V is applied after bringing each of the conductor bumps into contact with the thermal oxide film and lowering the bump support member by the amount of lowering is between the lower-limit value of 1 $\mu$A and the upper-limit value of 10 $\mu$A. If the gate leakage current value in any of the conductor bumps does not fall within the permissible range shown in FIG. 22 after the amount of lowering is set to every possible value, it is judged that the conductor bumps have reached their lifetime.

Figure 21:
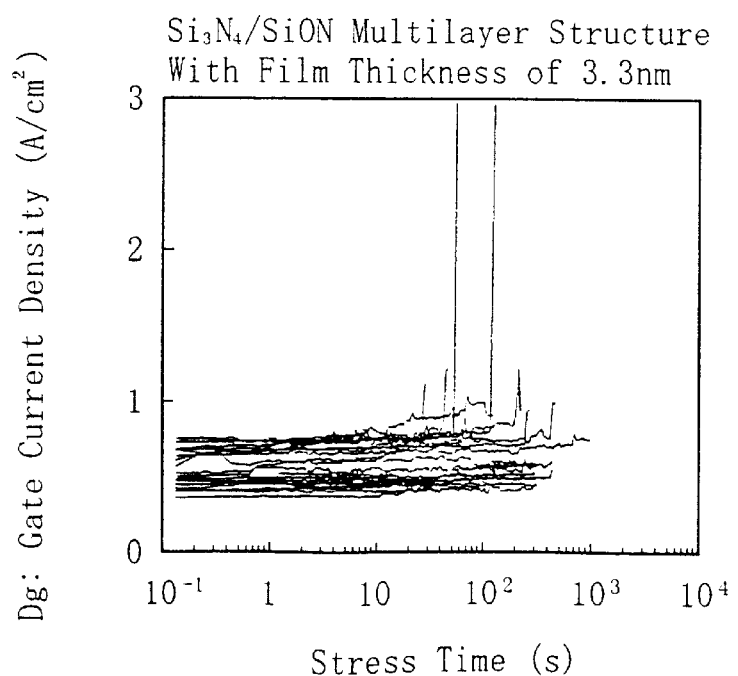
FIG. 21 is a view showing data obtained as a result of conducting a TDDB test after calibrating the pressing force by using an apparatus for evaluating an insulating film of the seventh embodiment.

FIG. 21 is a view showing data obtained as a result of applying a gate voltage Vg at a room temperature in a MIS structure composed of the conductor bumps, the gate insulating film, and the silicon substrate after calibrating the pressing force and thereby performing a TDDB test by using an apparatus for evaluating an insulating film of the present embodiment. In the drawing, the horizontal axis represents an elapsed time (s) from the application of the gate voltage Vg and the vertical axis represents a gate leakage current (A). The breakdown of the gate insulating film occurs at the time at which the gate leakage current Ig increases abruptly in the drawing. The TDDB test was performed by using a Si$_3$N$_4$/SiON multilayer film with a thickness of 3.3 nm as a gate insulating film under the conditions that the substrate temperature was 100° C. and a voltage at the gate electrode was −3.4 V. As can be seen from the drawing, reduced variations in the gate current density Dg indicate that the electric characteristic can be evaluated by the TDDB test or the like under stable conditions.

Although the present embodiment has determined the standard for calibration for the thermal oxide film with a thickness of 4 nm, the standard for calibration is not limited thereto. Any standard for calibration can be used provided that a proper pressing force is obtained in terms of a current-voltage characteristic from the contact area between each of the conductor bumps and the insulating film (gate insulating film) on the wafer (semiconductor substrate) responsive to the pressing force.

Although the present embodiment has performed calibration only once prior to the TDDB measurement and performed the TDDB test without performing calibration thereafter, if the measurement point is moved as shown in the second embodiment, the same degree of effect is achievable in accordance with a method in which calibration is performed every time before measurement is performed or a method in which calibration is performed once and then measurement is performed simultaneously at individual points on a single wafer.

The type of the evaluation of the insulating film after calibration is not limited to the TDDB test performed in the present embodiment. There can be performed various types of evaluation for a MIS structure, which will be described later.

Even if a wafer composed of a material other than silicon is used in the method for calibrating the pressing force, equal effects to those achieved in the present embodiment are achievable.

Embodiment 8

Figure 24:
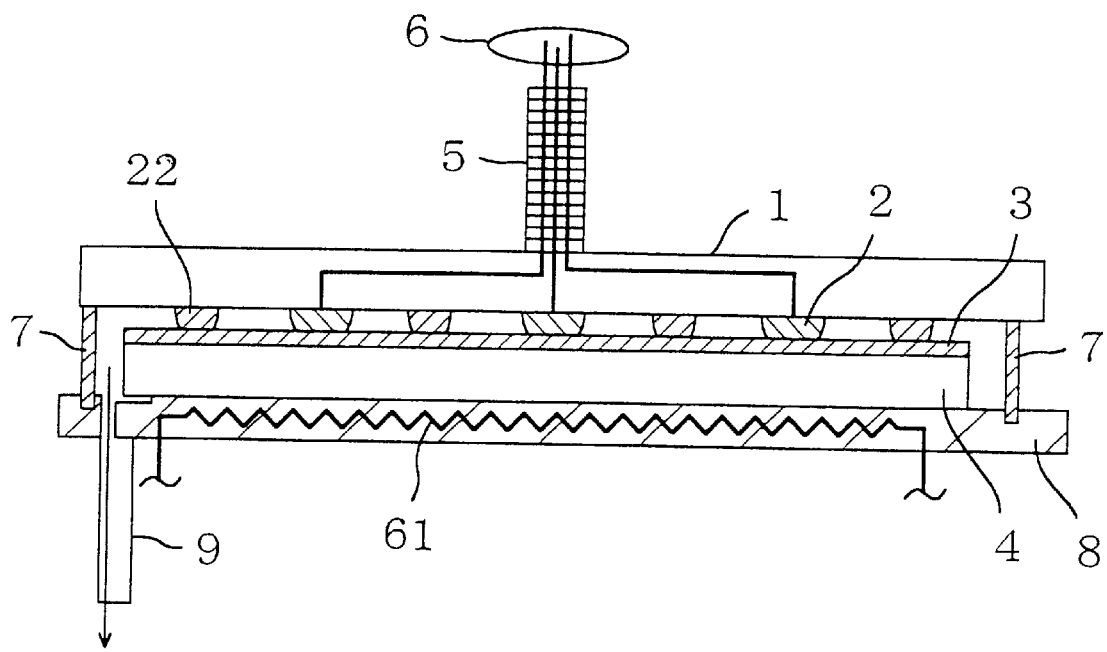
FIG. 24 is a cross-sectional view of an apparatus for evaluating an insulating film which has an internal heater in a wafer stage in an eighth embodiment.

FIG. 24 is a cross-sectional view showing a structure of an apparatus for evaluating an insulating film in an eighth embodiment.

The present embodiment is characterized in that an internal heater 61 for heating the silicon substrate 4 is provided additionally in the wafer stage 8 to the structure shown in FIG. 9. Specifically, the present embodiment evaluates the gate insulating film 3 for the characteristics thereof, while maintaining the temperature of the silicon substrate 4 at, e.g., 100° C. by means of the heater 61 as a substrate heating mechanism. By thus heating the silicon substrate 4, an acceleration test can be performed on the characteristics of the gate insulating film 3. Since an elastic ratio varies generally depending on temperature, it becomes possible to adjust the elastic ratio of each of the conductor bumps 2 to a value which permits the contact area between each of the conductor bumps 2 and the gate insulating film 3 to be kept stably in a proper range.

Figure 25:
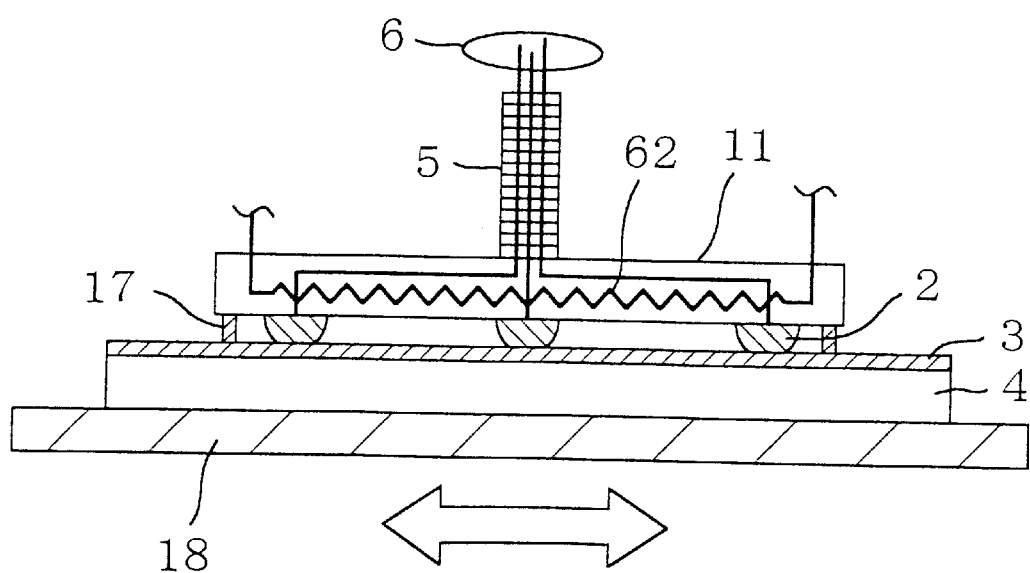
FIG. 25 is a cross-sectional view of an apparatus for evaluating an insulating film which has an internal heater in a bump support member in a variation of the eighth embodiment.

FIG. 25 is a cross-sectional view showing a structure of an apparatus for evaluating an insulating film in a variation of the present embodiment. As shown in the drawing, the apparatus for evaluation in the variation has an internal heater 62 provided additionally in the bump support member 11 to the apparatus for evaluating an insulating film shown in FIG. 7. The apparatus for evaluating an insulating film in the variation can also achieve the same effects achieved by the apparatus for evaluation shown in FIG. 24.

Embodiment 9

In the present embodiment, the apparatus and method used in each of the first to eighth embodiments are used as a measuring apparatus and method for applying a pressure. To reduce the number of bumps used for measurement, the present embodiment relatively rotates the wafer and the bumps.

Figure 27:
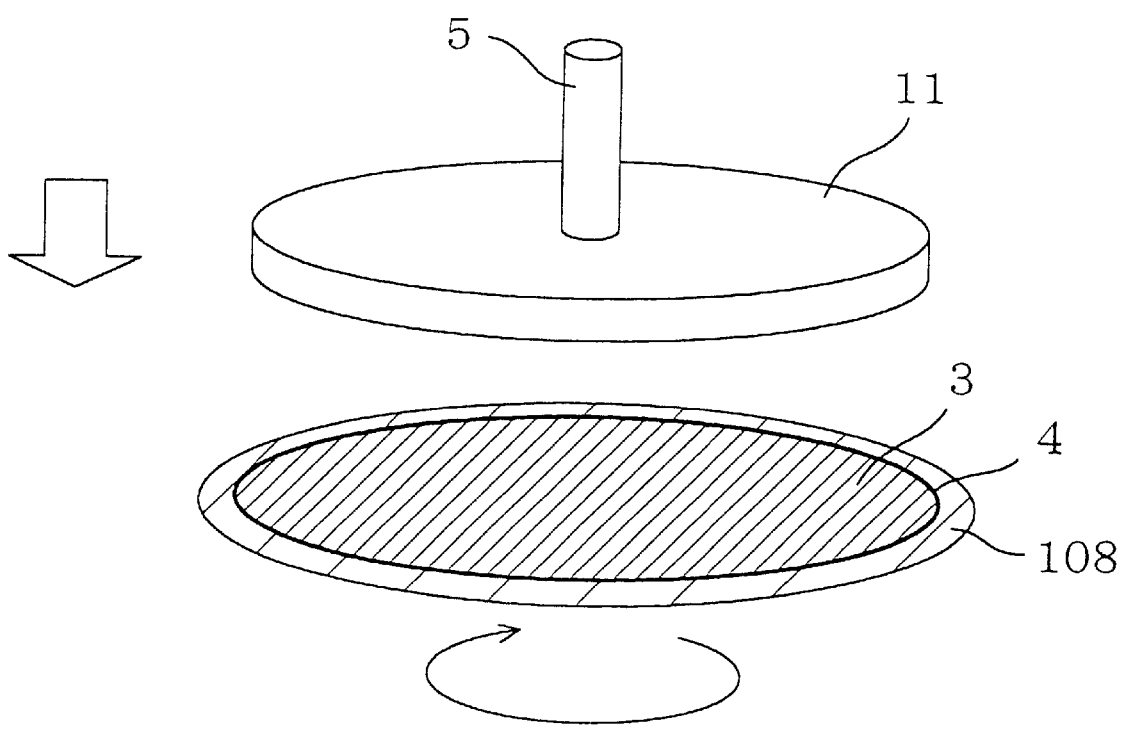
FIG. 27 is a perspective view conceptually showing a principal portion of an apparatus for evaluation in a ninth embodiment of the present invention.

FIG. 27 is a perspective view conceptually showing a principal portion of an apparatus for evaluation in a ninth embodiment of the present invention. As shown in the drawing, the present embodiment uses a rotatable wafer stage 108 and the bump support member having the structure shown in each of FIGS. 7, 12, 15, 16, 18, and 25. A gate leakage current is measured at different portions by rotating the wafer stage 108 by a specified angle θ, while fixing the bump support member 11. An O-ring 17 as shown in FIG. 7, 12, 15, 16, 18, or 25 is interposed between the bump support member 11 and the gate insulating film 4, though it is not shown in FIG. 27. The space between the bump support member 11 and the gate insulating film 4 is evacuated by means of an evacuation pipe or a vacuum bump which is not shown. Alternatively, an O-ring 4 as shown in FIG. 4 or the like may also be provided or an O-ring may not be provided at all as shown in FIG. 3.

Figure 28:
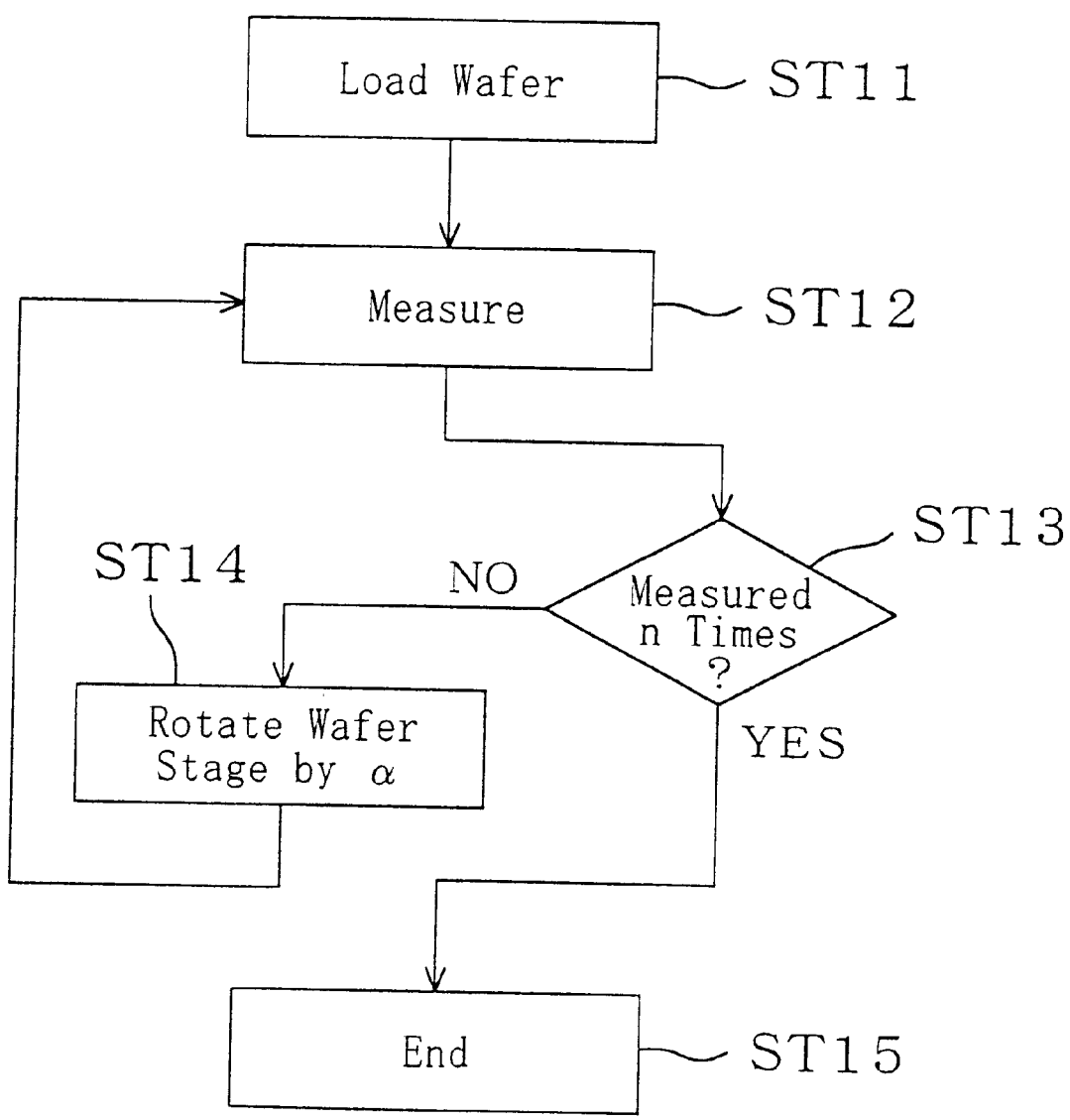
FIG. 28 is a flow chart showing the procedure of a method for evaluation in the ninth embodiment.

FIG. 28 is a flow chart showing the procedure of a method for evaluation in the ninth embodiment. First, in Step S11, a wafer with an insulating film as an object to be measured (the silicon substrate 4 provided with the gate insulating film 3 composed of the silicon oxide film shown in FIG. 27) is placed on the wafer stage 108 and a pressing force is applied between each of the conductor bumps and the gate insulating film (loading of the wafer). At that time, the pressing force is calibrated such that the contact area between each of the conductor bumps and the gate insulating film falls within a desired range. As described above, the calibration is performed by examining whether or not a gate leakage current caused when a specified gate voltage is applied with the application of a given pressing force is within a range of the gate leakage current when the gate area (contact area) in a MIS structure under the present test is assumed to be in a proper range.

Then, in Step ST12, the leakage characteristic of the insulating film and an electric characteristic thereof, such as TDDB, are analyzed (measured). In Step ST13, it is judged whether measurement has been perform n times. It has been determined preliminarily that the conductor bumps are brought into contact with all of desired measurement points on the wafer by the n times of measurement. If the answer is NO as a result of judgment made in Step ST13, the wafer stage is rotated by a specified angle α in Step ST14 and then the whole process returns to Step ST12. By thus repeating the measurement and the rotation of the wafer stage, the gate leakage current (I-V characteristic) is measured completely at every desired portion. The whole process then advances to Step ST15, where the control is completed.

Figure 29:
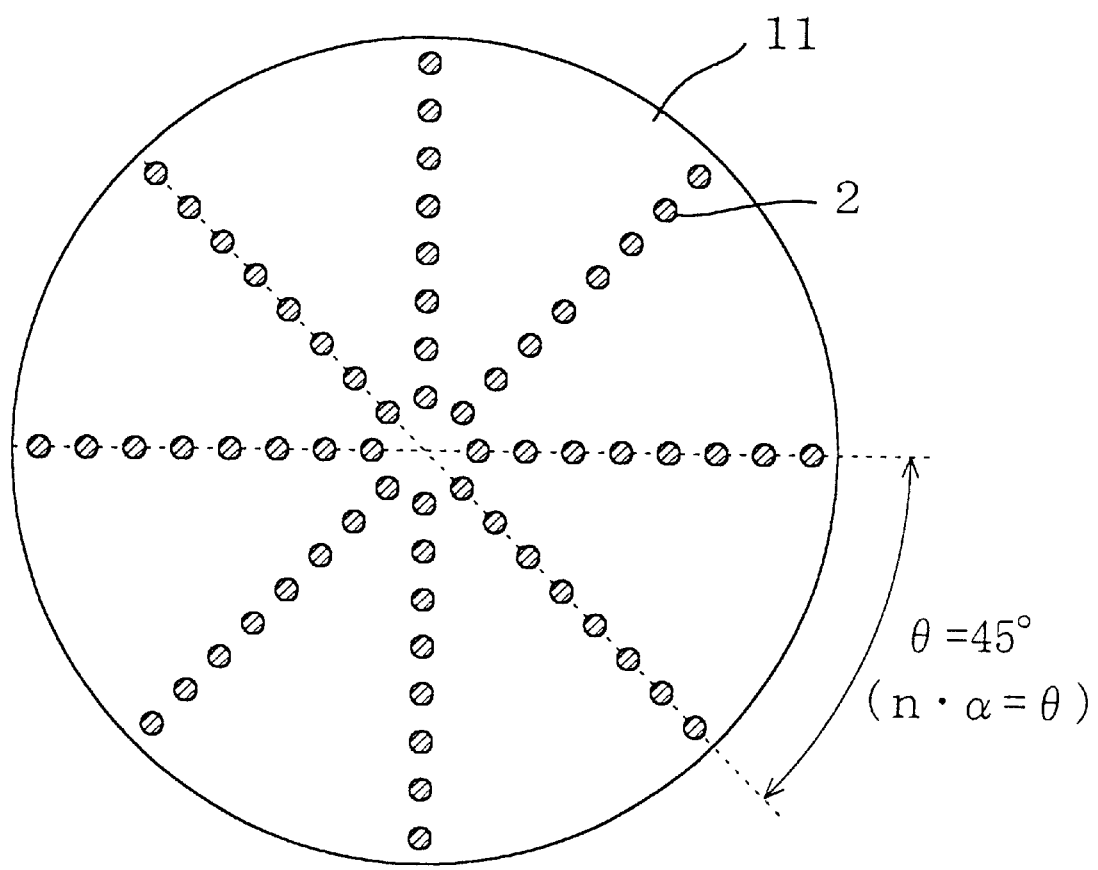
FIG. 29 is a plan view showing an example of an arrangement pattern for conductor bumps in a bump support member of the ninth embodiment.
Figure 30:
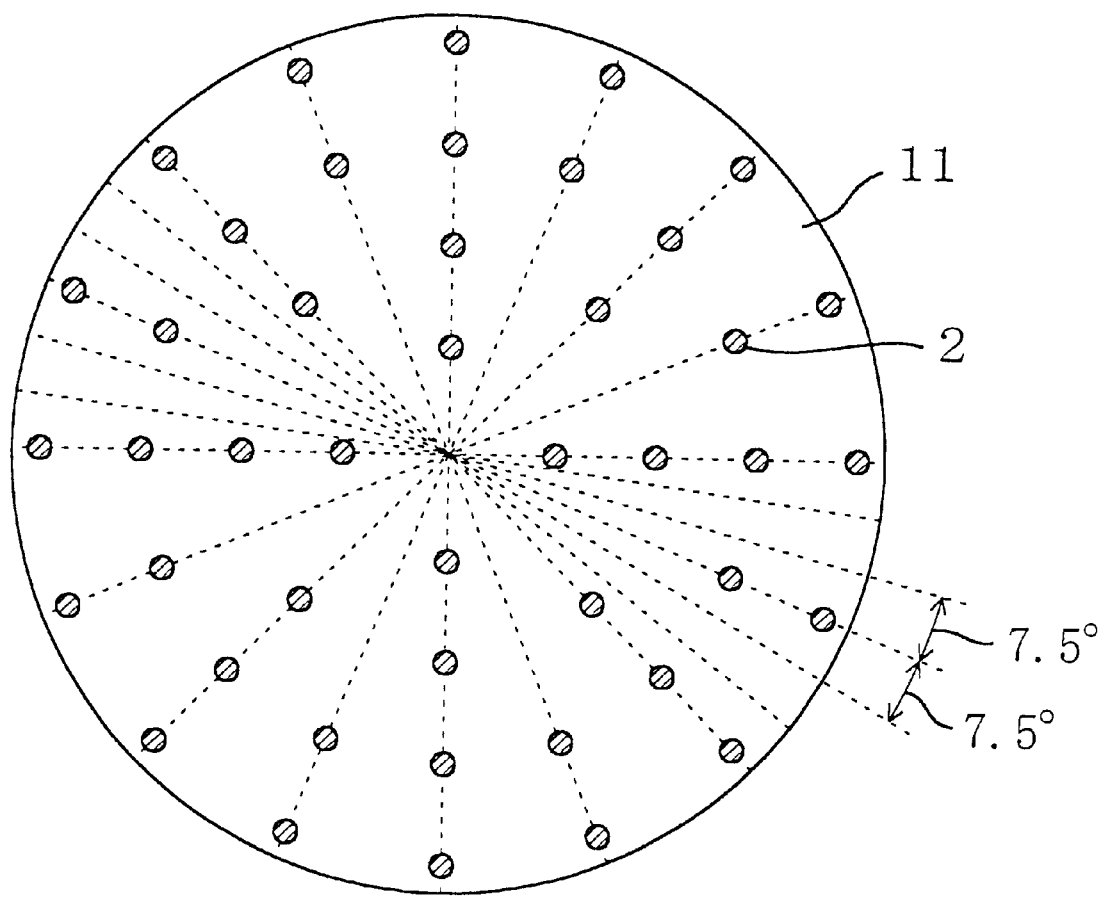
FIG. 30 is a plan view showing another example of the arrangement pattern for the conductor bumps in the bump support member of the ninth embodiment.

FIGS. 29 and 30 are plan views showing examples of an arrangement pattern for the conductor bumps 2 in the bump support member 11.

In the bump support member 11 shown in FIG. 29, sixty-four conductor bumps 2 are arranged in eights at radially equidistant positions aligned on the eight radii which circumferentially divide the bump support member 11 into eight sectors, thereby forming an eight-fold rotationally symmetrical pattern. If the wafer stage rotates by the specified angle α (45°) which is a value obtained by dividing 360° (2π) by the order of rotational symmetry, the conductor bumps 2 reach the positions at which the gate leakage currents in other conductor bumps 2 have been measured already. The number n of times of measurement has been determined preliminarily such that, if the wafer stage 108 is rotated n times each by the angle α, the total angle of rotation reaches θ. If the number n of times of measurement has thus been determined, it follows that the gate leakage current is measured at every desired portion by rotating the wafer stage (n−1) times each by the angle α and measuring the gate leakage current (I-V characteristic) in addition to the measurement at the initial position. The judgment made in Step ST13 shown in the flow chart of FIG. 28 indicates that the measurement has been performed at every desired portion. It is to be noted that the conductor bumps 2 each having a diameter of several tens of micrometers are depicted relatively large in contrast to the wafer having a diameter of about 8 inches. Accordingly, there is no such case where regions where the gate leakage currents in the conductor bumps 2 are measured overlap during the 45° rotation of the wafer stage 108.

Although the present embodiment has provided a reduced number of conductor bumps 2 on the bump support member 11, the rotation of the wafer stage allows for evaluation at a large number of portions. It is generally said that variations in the diameters of the conduct bumps 2 can be suppressed to ±5 μm. Since a reduction in the number of the conductor bumps 2 also reduces variations in the sizes of the conductor bumps 2, measurement accuracy is further increased.

In the bump support member 11 shown in FIG. 30, by contrast, forty-four conductor bumps 2 are arranged in fours, threes, or twos at radial positions aligned on the sixteen radii which circumferentially divides the bump support member 11 into sixteen sectors. In this case, measurement at the total of 132 points (44×3) is possible if the wafer stage 108 is rotated twice each by ±7.5°. In this example, the number of the conductor bumps 2 per unit area around the center point of the bump support member 11 is nearly the same as the number of the conductor bumps 2 per unit area around the outer periphery of the bump support member 11. When the conductor bumps 2 are arranged as shown in FIG. 29, the density of the conductor bumps 2 arranged around the center point of the bump support member 11 is high and the density of the conductor bumps 2 arranged around the outer periphery of the bump support member 11 is low. This provides non-uniform contact pressures between the bumps and the insulating film, which are low around the center of the wafer and high around the outer periphery of the wafer. If the conductor bumps 2 are arranged as shown in FIG. 30, by contrast, a substantially uniform contact pressure is provided advantageously between each of the bumps and the insulating film over the entire surface of the wafer.

The conductor bumps 2 may also be arranged to have no symmetry. In that case, it is also possible to rotate the wafer stage 108 each time by the angle α such that the total angle of rotation becomes 360° by arranging all the conductor bumps 2 at different radial positions. The arrangement allows measurement at extremely numerous portions.

In addition to the conductor bumps 2 shown in FIGS. 29 and 30, it is also possible to provide the bump support member 11 with dummy bumps as described in the foregoing embodiment.

Figure 31:
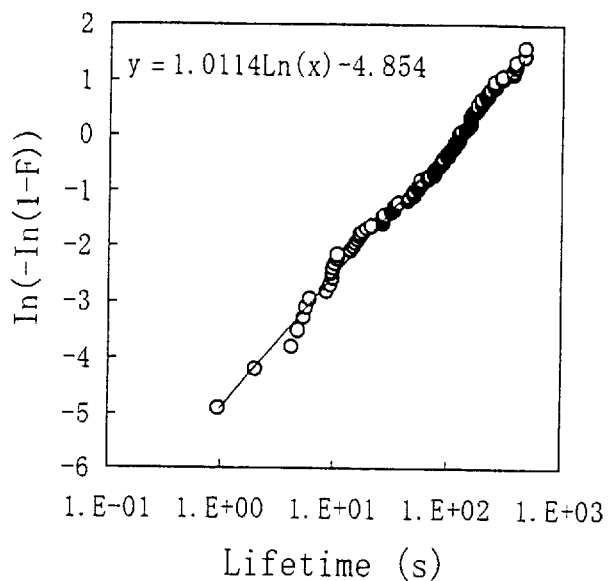
FIG. 31 is a view showing the result of evaluating the gate leakage characteristic of an insulating film having a multilayer structure consisting of a silicon nitride film and a silicon oxide film by using the apparatus for evaluation of the ninth embodiment.

FIG. 31 is a view showing the result of evaluating an insulating film having a multilayer structure consisting of a silicon nitride film and silicon oxide film for the gate leakage characteristic thereof by using the apparatus for evaluation of the present embodiment. The data shown in FIG. 31 has been obtained by performing measurement at the total of 132 (44×3) points by using the bump support member 11 having the conductor bumps 2 arranged thereon as shown in FIG. 30 and rotating the wafer stage 108 twice each by ±7.5°. In FIG. 31, the horizontal axis represents the time (lifetime) elapsed till the breakdown and the vertical axis represents the logarithm of the probability that an event complementary to a failure (failure rate F) occurs. In short, the points shown in FIG. 31 are so-called Weibull plots. An electric thickness of the $SiO_2$ film of the insulating film composed of the multilayer structure of the silicon nitride film and the silicon oxide film is about 2.1 nm, which has been calculated from the capacitance of the insulating film. The contact area between each of the conductor bumps 2 and the gate insulating film is about 1000 $\mu m^2$ and a voltage of −3.4 V is applied to each of the conductor bumps.

As a result, individual measurement data (Weibull plots) forms a nearly straight line and the inclination m of the Weibull plots becomes 1.01. According to the document (T. Nigam et al., IEEE/IRPS 98. 62(1998)), the use of the inclination m of the Weibull plots allows the lifetime to be estimated through a comparison between the contact area between each of the bumps and the insulating film and the gate area in an actual device. If t1 is an estimated lifetime of the actual device, t2 is an estimated lifetime by measurement using the bumps, A1 is the gate area of the actual device, and A2 is the contact area between each of the bumps and the insulating film (e.g., about 1000 $\mu m^2$), the lifetime of the actual device can be estimated based on the following expression:

$$t1/t2 = (A2/A1)^{1/m}.$$

Although the estimated lifetime t2 has not been calculated from the measurement of the gate leakage current using the conductor bumps in this example, since t2 is a value calculated from the time (lifetime) elapsed till the breakdown of the insulating film when several gate voltages are applied thereto, the estimated lifetime t2 at a working voltage can be calculated by using a well-known method by performing long-duration measurement of the gate leakage current according to the present embodiment and calculating the lifetime t at each of the voltages.

Since the estimation of a lifetime using area calculation generally requires a large amount of measurement data, the measurement of gate leakage currents (I-V characteristics) using a large number of bumps is preferably performed. However, it is difficult to form a bump support member with a large number of bumps each having a uniform configuration. Although the number of the conductor bumps 2 on the bump support member 11 is small, the present embodiment allows measurement of the gate leakage currents using the conductor bumps 2 at numerous portions by relatively rotating the bump support member 11 and the wafer stage 108. In particular, the mechanism for rotating the wafer stage 108 requires a simpler structure of wires than the mechanism for rotating the bump support member 11 so that measurement accuracy can be increased by rotating the wafer stage 108.

Embodiment 10

Figure 32:
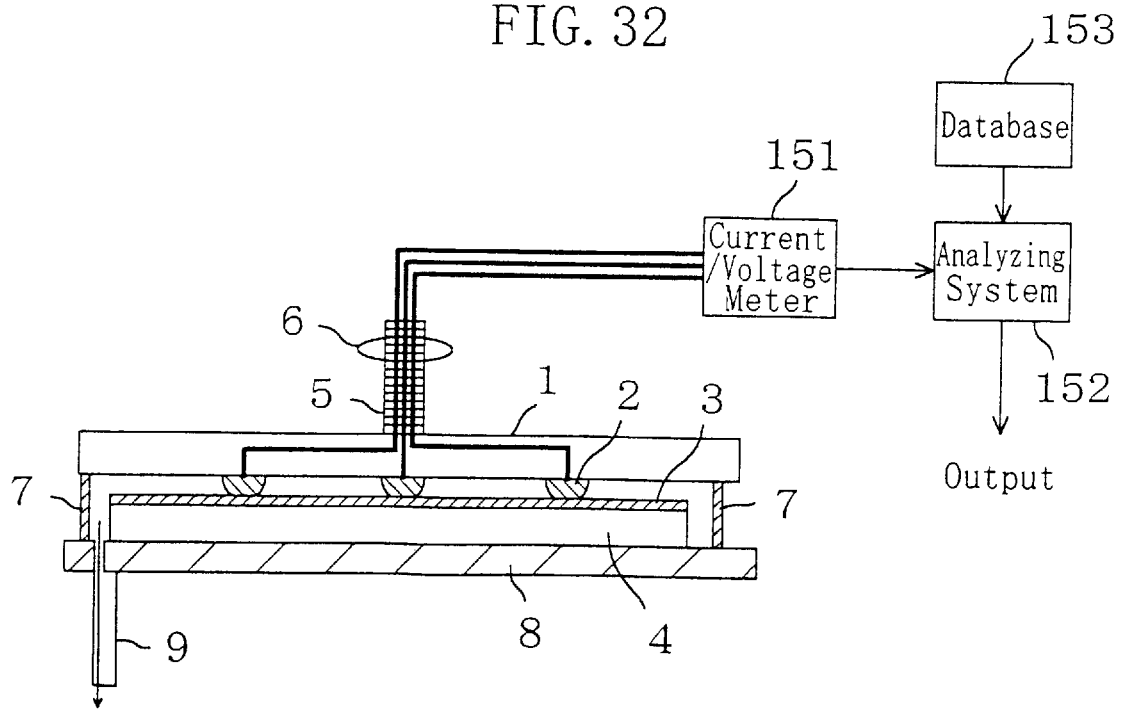
FIG. 32 is a cross-sectional view showing a structure of an apparatus for evaluating an insulating film in a tenth embodiment of the present invention.

FIG. 32 is a cross-sectional view showing a structure of an apparatus for evaluating an insulating film in a tenth embodiment of the present invention.

Into the apparatus for evaluating an insulating film of the present embodiment, a system for analyzing leakage currents in a wafer by performing area calculation based on the size of each of the conductor bumps has been incorporated. Specifically, the apparatus for evaluation of the present embodiment comprises a current/voltage meter 151 for measuring a current in each of the conductor bumps 2, an analyzing system 152, and a database 153 for organizing and storing the contact areas between the individual conductor bumps 2 and the gate insulating film 3.

Variations in the diameters of the conductor bumps 2 during the formation thereof can be kept within a range of 10 $\mu$m or less. Even if the number of the conductor bumps 2 is slightly large, each of the conductor bumps 2 can surely be brought into contact with the gate insulating film 3.

It is also possible to apply a load to the bump support member 11 in such a manner as to cause plastic deformation in some of the conductor bumps 2. By applying a load for causing the plastic deformation in some of the conductor bumps 2 between the bump support member 11 and the wafer 4 (wafer stage 8) prior to measurements, in particular, a given contact area is provided constantly between each of the conductor bumps 2 and the gate insulating film 3 during the measurement.

Figure 33:
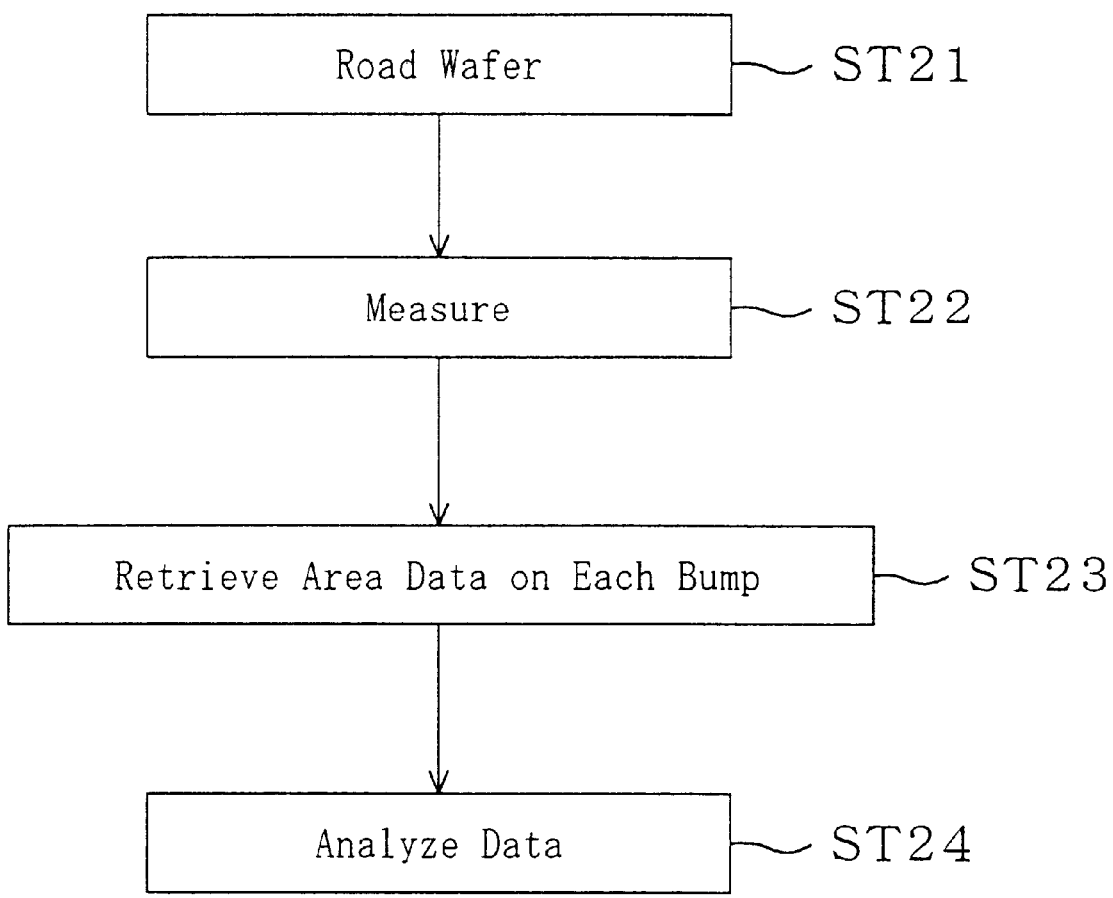
FIG. 33 is a flow chart showing the procedure of a method for evaluation in the tenth embodiment.

FIG. 33 is a flow chart showing the procedure of an evaluation method in the tenth embodiment. First, in Step ST21, a wafer with an insulating film as an object to be measured (the silicon substrate 4 provided with the gate insulating film 3 composed of a silicon oxide film shown in FIG. 32) is placed on the wafer stage 8 and a pressing force is applied between each of the conductor bumps and the gate insulating film (loading of the wafer). At this time, the pressing force is calibrated such that the contact area between each of the conductor bumps and the gate insulating film falls within a desired range. As described above, the calibration is performed by examining whether or not a gate leakage current caused when a specified gate voltage is applied with the application of a given pressing force is within the range of a gate leakage current when the gate area (contact area) in a MIS structure under the present test is assumed to be in a proper range.

Then, in Step ST22, the leakage characteristic of the insulating film and an electric characteristic thereof, such as TDDB, are analyzed (measured). As a method for measurement, there can be adopted various methods described in the foregoing embodiments. In Step ST23, the data stored in the database 153 is retrieved and measurement data from each of the bumps is analyzed by means of the analyzing system 152.

Figure 34:
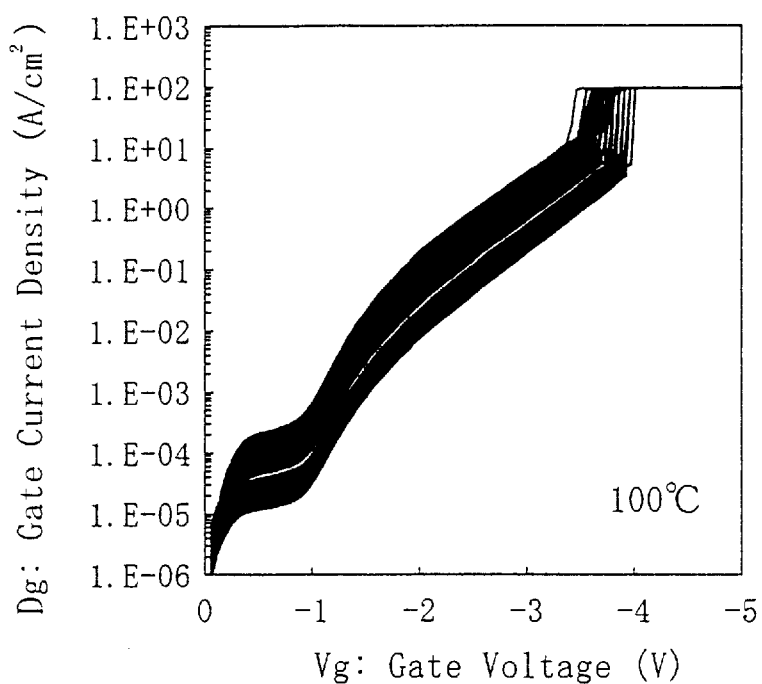
FIG. 34 is a view showing data on I-V characteristics when conductor bumps are assumed to have equal sizes without considering the respective sizes thereof.
Figure 35:
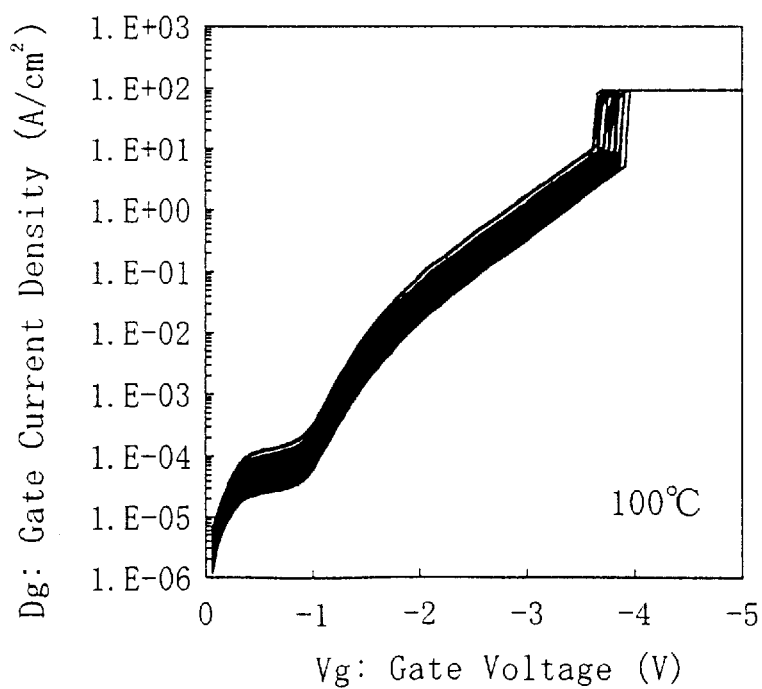
FIG. 35 is a view showing data on I-V characteristics when the respective sizes of the conductor bumps are considered.

FIG. 34 is a view showing data on the respective I-V characteristics of the conductor bumps when they are assumed to have equal sizes without considering the respective sizes of the conductor bumps. FIG. 35 is a view showing data on the respective I-V characteristics of the conductor bumps when consideration is given to the respective sizes of the conductor bumps.

Compared with the data on the I-V characteristics shown in FIG. FIG. 34, those shown in FIG. 35 have reduced variations. The variations still observed in the data on the I-V characteristics shown in FIG. 35 are primarily attributable to variations in the thickness of the gate insulating film on the wafer.

According to the present embodiment, measurement accuracy can be increased by thus organizing data on the respective sizes of the conductor bumps 2 into a database, retrieving the data on the respective sizes of the conductor bumps 2 from the database during the measurement of the gate leakage currents (I-V characteristics), calculating actual current densities through area calculation, and analyzing the gate leakage currents.

Other Embodiments

Structure of Apparatus for Evaluation

In those of the first to eighth embodiments in which the wafer stages are movable, it is also possible to design the bump support member such that it moves laterally, while fixing the wafer stage. Although the wafer stage is fixed in a vertical direction in each of the foregoing embodiments, it is also possible to move the wafer stage in the vertical direction, while fixing the bump support member in the vertical direction.

Types of Evaluation

Although each of the foregoing embodiment has described an example in which the I-V characteristic, leakage current, or reliability (TDDB) is used as a parameter for evaluating the gate insulating film, the type of evaluation in the present invention is not limited thereto. The present invention is also applicable to the case where an insulating film in a MIS structure composed of the insulating film interposed between a conductor layer in a substrate and conductor bumps is evaluated for various characteristics.

Examples of such characteristics of the insulating film include, e.g., the thickness t of the insulating film and the dielectric constant $\in$ of the insulating film in addition to the foregoing I-V characteristic, leakage characteristic, and reliability. If it is assumed that the capacitance COx of the insulating film has been determined by using a C-V measurement method performed by superimposing an ac voltage on a dc bias, it becomes possible to calculate the dielectric constant $\in$ (or relative dielectric constant) of the dielectric film the thickness t of which has already been known by using the relationship represented by $\in = COx \cdot t$. It is also possible to measure the thickness t of the insulating film the specified dielectric constant of which has already been known.

Types of Insulating Film as Object to be Evaluated

Examples of the insulating film include various dielectric films such as a silicon oxide film ($SiO_2$ film), a silicon nitride film ($Si_3N_4$ film), a silicon oxynitride film (SiON film), a tantalum oxide film ($Ta_2O_5$ film), a zirconia film ($ZrO_2$ film), and a zinc oxide film (ZnO film). The insulating film need not necessarily have the function of a gate insulating film. Any insulating film may be used appropriately provided that it is interposed between the conductor bumps and the conductor layer in the substrate to serve as an insulating film in a MIS structure when it is evaluated for the characteristics thereof.

Conductor Bumps

Although each of the foregoing embodiments has used Au (gold) bumps as the conductor bumps, a conductor material other than Au (gold) may also be used as a material composing the conductor bumps of the present invention. Preferably, a material having low electric resistance, a lower hardness than the insulating film, and no adverse effect on a semiconductor element upon contact with the insulating film is used to compose the conductor bumps. Examples of such a material other than Au include platinum (Pt), palladium (Pd), silver (Ag), copper (Cu), and nickel (Ni), any of which may be used.

Each of the conductor bumps need not necessarily be composed of a single metal or alloy. For example, it is also possible to form a skeleton of a sponge made of nickel or the like, plating the skeleton with Au, and thereby providing an elastic conductor bump having low resistance. In this case, the pores in a sponge made of nickel or the like may be filled substantially completely with Au or may be unfilled.

In the case of measuring an extremely thin insulating film, the size of each of the conductor bumps is preferably 1000 $\mu m^2$ or less and, more preferably, 200 $\mu m^2$ or less.

Prediction of Deformation

Since the respective sizes of the conductor bumps 2 can be measured individually, it is possible to predict the amount of deformation of each of the conductor bumps when a given load is applied between the bump support member and the wafer stage (wafer), i.e., the contact area between each of the conductor bumps and the gate insulating film depending on the size of each of the conductor bumps by utilizing the relationship between pressure and deformation shown in FIG. 26 or by calculating the amount of plastic deformation. By performing evaluation (measurement of the I-V characteristic or the like) based on the predicted contact area in each of the foregoing embodiments, measurement accuracy can be increased.

In each of the foregoing embodiments, it is also possible to apply, prior to evaluation (measurement), a given load between the bump support member and the wafer stage (wafer) to cause plastic deformation in at least some of the conductor bumps and preliminarily measure the area of a planarized upper surface of each of the conductor bumps that has been plastically deformed. The contact area between each of the conductor bumps and the gate insulating film during measurement can be predicted from the area of the upper surface of each of the conductor bumps that have been plastically deformed. When the I-V characteristic or the like is calculated thereafter from data obtained by measuring gate leakage currents, the current densities can be calculated with high accuracy by using the predicted contact area of each of the conductor bumps, so that evaluation accuracy is increased.

What is claimed is:

1. An apparatus for evaluating an insulating film provided on a conductor layer in a semiconductor substrate for characteristics or dimensions thereof, the apparatus comprising:

a measuring member having one or more conductor bumps and a wire connected to each of the conductor bumps; and pressing-force adjusting means for adjusting a relative pressing force exerted on each of the conductor bumps and the insulating film such that the relative pressing force falls within a specified range;

wherein the conductor bumps come into contact with the insulating film when the insulating film is evaluated, and wherein a MIS structure comprising the insulating film is provided interposed between the conductor bumps and the semiconductor substrate.

2. The apparatus for evaluating an insulating film of claim 1, wherein the measuring member has a dummy bump which is not used to evaluate the insulating film for the characteristics thereof.

3. The apparatus for evaluating an insulating film of claim 2, wherein the pressing-force measuring means has a mechanism for reducing a pressure in a space between the substrate and the measuring member.

4. The apparatus for evaluating an insulating film of claim 2, wherein each of the conductor bumps is composed of a material having a lower hardness than the insulating film.

5. The apparatus for evaluating an insulating film of claim 2, wherein a size of each of the conductor bumps and the dummy bump is set such that a contact area between each of the conductor bumps and the insulating film resulting from the pressing force falls within a specified range.

* * * * *